(12) United States Patent
Murata et al.

(10) Patent No.: US 7,259,032 B2
(45) Date of Patent: Aug. 21, 2007

(54) HERMETICALLY SEALING A PACKAGE TO INCLUDE A BARRIER METAL

(75) Inventors: Koji Murata, Kusatsu (JP); Takashi Iwamoto, Kusatsu (JP); Hiroki Horiguchi, Ritto (JP); Ryuichi Kubo, Otsu (JP); Hidetoshi Fujii, Shiga-ken (JP); Naoko Aizawa, Shiga-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 836 days.

(21) Appl. No.: 10/713,253

(22) Filed: Nov. 17, 2003

(65) Prior Publication Data

US 2004/0100164 A1 May 27, 2004

(30) Foreign Application Priority Data

Nov. 26, 2002 (JP) ............................. 2002-341763
Oct. 2, 2003 (JP) ............................. 2003-344041

(51) Int. Cl.
*H01L 21/00* (2006.01)

(52) U.S. Cl. .................. 438/26; 257/684; 257/E21.513

(58) Field of Classification Search .................. 438/26; 257/684, E21.513
See application file for complete search history.

(56) References Cited

U.S. PATENT DOCUMENTS 6,853,067 B1 * 2/2005 Cohn et al. .................. 257/704

7,138,293 B2 * 11/2006 Ouellet et al. .............. 438/106

FOREIGN PATENT DOCUMENTS

| JP | 4-293310 | 10/1992 |
|----|----------|---------|
| JP | 7-283334 | 10/1995 |
| JP | 9-162690 | 6/1997 |
| JP | 2000-77970 | 3/2000 |
| JP | 2001-68580 | 3/2001 |

* cited by examiner

*Primary Examiner*—William David Coleman
(74) *Attorney, Agent, or Firm*—Keating & Bennett, LLP

(57) ABSTRACT

A method for manufacturing an electronic device includes the steps of forming a first resist pattern on a primary surface of a SAW element, the first resist pattern having openings at positions corresponding to those at which bumps and a sealing frame are to be formed, sequentially forming metals over the first resist pattern, the metals being formed into adhesion layers, barrier metal layers, and solder layers, removing the first resist pattern on the SAW element such that the bumps and the sealing frame are simultaneously formed. When the bumps and the sealing frame of the SAW element are bonded to bond electrodes of the bond substrate, the solder layers are melted and alloyed by heating.

19 Claims, 14 Drawing Sheets

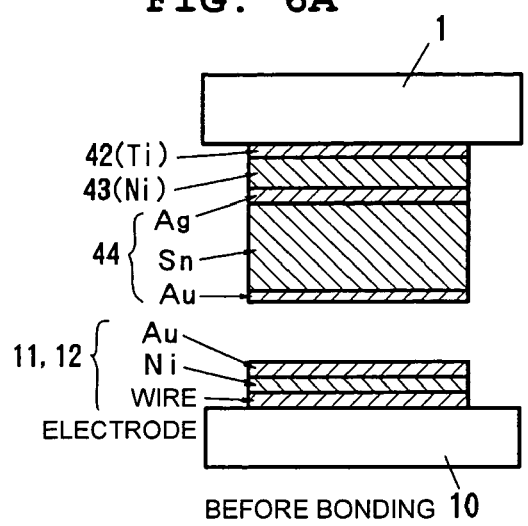
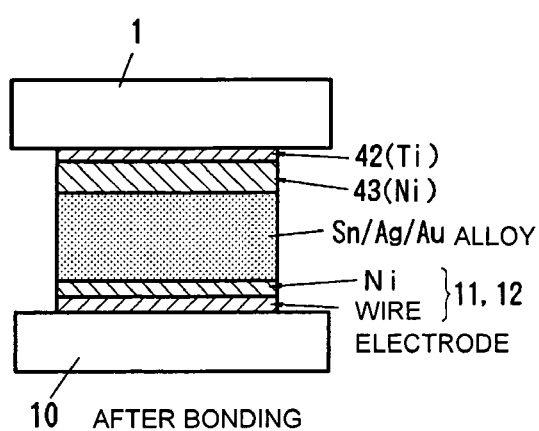

BONDING

DICING

HERMETICALLY SEALING A PACKAGE TO INCLUDE A BARRIER METAL

BACKGROUND OF THE INVENTION

1. Field of the Invention

The present invention relates to methods of manufacturing electronic devices, and more particularly, to a method of manufacturing an electronic device in which a communication element, such as a surface acoustic wave filter, a piezoelectric filter using piezoelectric thin-film resonators, an optical signal modulator, or a high-frequency element, is flip-chip mounted on a bond substrate and is then hermetically sealed.

2. Description of the Related Art

In recent years, in accordance with the trend to make electronic apparatuses compact and light weight, multifunctionality has been required for electronic devices. According to the trend described above, piezoelectric devices used for communication apparatuses including mobile phones, such as a surface acoustic wave filter (hereinafter referred to as a "SAW filter") and a piezoelectric filter (hereinafter referred to as a Bulk Acoustic Wave Filter or "BAW filter") including piezoelectric resonators, have also been required to be compact and light-weight.

The BAW filter includes piezoelectric resonators arranged in a ladder pattern or in a lattice pattern. As the piezoelectric resonator, for example, a piezoelectric resonator including a vibration portion, which includes a thin-film composed of at least one piezoelectric thin film (formed of, for example, ZnO or AlN), and at least one pair of a top electrode and a bottom electrode, which face each other with the thin-film provided therebetween, is provided over an opening or a concave portion provided in an Si substrate, or a piezoelectric resonator in which a space is provided between a bottom electrode and an Si substrate which is not provided with an opening or a concave portion. In the piezoelectric resonators described above, since vertical vibration generated in the vibration portion is used, a vibration space must be provided, and in addition, the vibration portion must be protected from moisture, dust, and other contaminants.

In addition, a SAW filter includes a piezoelectric substrate composed, for example, of quartz, $LiTaO_3$, or $LiNbO_3$, and a pair of comb-shaped electrode portions (interdigital transducer, hereinafter referred to as an "IDT") provided thereon, which are made of a metal such as Al. In the surface acoustic wave filter described above, a vibration space for propagation of a surface acoustic wave must be provided at the comb-shaped electrode portions and the piezoelectric substrate, and in addition, the comb-shaped electrode portions must be protected from moisture, dust, and other contaminants.

The BAW filter and the SAW filter described above are each typically formed by the steps of applying a die-bonding agent on the bottom surface of a ceramic package made of alumina or other suitable material, mounting an element for the BAW filter or the SAW filter on the package via die-bonding, connecting electrodes of the element to terminals provided inside the package via wire bonding, and sealing the package with a lid. In addition, to reduce the size of the BAW filter and the SAW filter, a method has also been performed including the steps of forming electrode lands on the bottom surface of a package made of alumina or other suitable material, mounting an element for the BAW filter or the SAW filter on the package by flip-chip bonding, and sealing the package with a lid.

However, according to the structure described above, although the size of the elements for the BAW filter and the SAW filter are reduced, when the size of the package is not reduced, the sizes and heights of the BAW filter and the SAW filter cannot be reduced. In addition, that cost of forming a small package is high. Furthermore, in particular for the BAW filter, since the vibration portion is provided in an opening or in a concave portion of the substrate, the vibration portion is damaged by impact generated in a step in which an element is processed by dicing, is picked up for mounting, or is die-bonded. Accordingly, recently, a chip size package (hereinafter referred to as "CSP") BAW filter and a CSP SAW filter have been proposed.

In a conventional CSP SAW filter, an element (SAW element) for the SAW filter is mounted on a substrate. When this SAW element is mounted on the substrate and is then packaged, the following conditions must be satisfied.

(1) A hermetically sealed structure in which an IDT (primarily composed of Al) defining the SAW element is isolated from an ambient atmosphere for preventing corrosion.

(2) Electrical conduction between electrodes of the SAW element and the bond substrate is required.

A mounting structure of a surface acoustic wave device which satisfies the above-described conditions is disclosed in Japanese Unexamined Patent Application Publication Nos. 4-293310 and 2000-77970.

In Japanese Unexamined Patent Application Publication No. 4-293310, a surface acoustic wave device includes a SAW element that is flip-chip bonded to a bond substrate with bumps provided therebetween, and a sealing frame surrounding IDT electrodes and the bumps is bonded to the bond substrate so as to provide a vibration space and to achieve a hermetic seal. In the case described above, the bumps and the sealing frame are both composed of solder and are simultaneously formed by applying cream solder on the bond substrate by screen printing, followed by melting and solidifying the solder. After the SAW element is arranged on the bond substrate such that input-output electrodes of the SAW element are brought into contact with the bumps, the bumps are bonded to the input-output electrodes by applying heat and pressure, and at the same time, the solder sealing frame is bonded to a seal ring provided at the element side.

According to Japanese Unexamined Patent Application Publication No. 2000-77970, similar to the structure described above, a SAW element is flip-chip bonded to a bond substrate, and a sealing frame surrounding IDT electrodes and bumps is bonded to the bond substrate so as to provide hermetic seal. That is, input-output electrodes and a seal ring are provided on a surface of the SAW element, lead electrodes and a seal ring are provided on the bond substrate, bumps are provided on the lead electrodes, and a solder sealing frame is provided on the seal ring at the substrate side. The bumps are formed on the lead electrodes by a wire bonding method, and the solder sealing frame is formed by the steps of printing a solder paste on the seal ring at the substrate side, and reflowing the solder paste followed by washing.

According to Japanese Unexamined Patent Application Publication Nos. 4-293310 and 2000-77970, the following problems may arise since the solder sealing frame is formed at the bond substrate side, and a printing method is used therefor.

Since the solder sealing frame is formed on the bond substrate which is a portion of a mother substrate including a plurality of the bond substrates, when solder is printed on the substrate, cumulative pitch accuracy of the electrodes formed on the mother substrate and the accuracy of a metal mask for printing must be consistent with each other, and as a result, it becomes difficult to form a finer sealing frame. Hence, the size of an element is increased, and the number of the elements formed on the mother substrate is decreased.

In addition, since a printing amount of solder that is generated in printing varies due to warping of the mother substrate and variation in electrode thickness, the height of the bumps varies after reflowing, and as a result, bonding defects occur. Furthermore, in reflowing, since the solder aggregates at corner portions to form convex shapes, the height of the solder varies, and as a result, bonding defects occur.

In order to solve the problems described above, a method of forming a sealing frame may be used in which a solder paste is printed on a wafer having a number of elements formed thereon followed by reflowing. However, in the method described above, the accuracy of the solder sealing frame cannot be effectively obtained, performance is degraded due to damage to electrodes on the surface of the wafer caused by a printing mask, the wafer is broken by a squeegee printing pressure applied in printing or by heat applied for reflowing the solder, and other defects are likely to occur.

In Japanese Unexamined Patent Application Publication No. 9-162690, a method is disclosed in which a SAW element is flip-chip bonded to a bond substrate, and a sealing frame surrounding IDT electrodes and bumps is bonded to the bond substrate so as to provide a hermetic seal. That is, input-output electrodes and a seal ring are formed on the surface of the SAW element by a lift-off technique, and the bumps and the sealing frame are formed on the input-output electrodes and the seal ring, respectively, by a lift-off technique.

The bumps and the sealing frame each have a two-layered structure, for example, of nickel and gold. In addition, lead electrodes and a seal ring are provided on the bond substrate. The seal ring on the bond substrate is formed, for example, by performing seal printing of gold. Subsequently, the SAW element is preliminarily pressed onto the bond substrate and is then bonded thereto by reflowing.

In the case disclosed in Japanese Unexamined Patent Application Publication No. 9-162690, since a lift-off technique is used instead of a printing method, the problems described above do not occur. However, since gold having a melting point higher than that of solder is used for the bumps and the sealing frame, the temperature is significantly increased in reflowing, and properties of the SAW element are degraded. In addition, since a large amount of gold is used, the cost is increased substantially.

In addition, when gold having a predetermined thickness is processed by a lift-off technique, since stress generated when a film is formed using gold is large, a resist pattern used for the lift-off is considerably deformed, and as a result, deviation in the patterns of the bumps and the sealing frame often occur.

Furthermore, since a seal ring is provided on the surface of the SAW element in advance, and the sealing frame is formed thereon, extremely high alignment accuracy is required, and in addition, the width of the seal ring must be greater than that of the sealing frame. As a result, the size of the SAW element is increased.

In addition, in a CSP BAW filter, an element (BAW element) for the BAW filter is bonded to a bond substrate.

When this BAW element is mounted on the bond substrate and is then packaged, the following conditions must be satisfied.

(1) A hermetically sealed structure in which a top electrode and a bottom electrode, which define the BAW element, are isolated from an ambient atmosphere for preventing corrosion.

(2) Electrical conduction between electrodes of the BAW element and the bond substrate.

A mounted structure of a BAW device, which satisfies the above-described conditions, is disclosed in Japanese Unexamined Patent Application Publication Nos. 7-283334 and 2001-68580.

In Japanese Unexamined Patent Application Publication No. 7-283334, a BAW filter includes a BAW element that is flip-chip bonded to a bond substrate via bumps provided therebetween, and a sealing member (corresponding to the sealing frame) surrounding a vibration portion and the bumps is bonded to the bond substrate so as to provide a vibration space and a hermetic seal. In the case described above, the sealing member (corresponding to the sealing frame) is formed of a low melting point glass, such as lead glass, or cream solder.

According to Japanese Unexamined Patent Application Publication No. 7-283334, when a low melting point glass is used for the sealing member (corresponding to the sealing frame), the following problems arise. First, since a low melting point glass such as lead glass contain lead which causes environmental problems, the use thereof is not preferable. However, when glass which does not contain lead is used, the melting point is increased to approximately 400° C. or more, and as a result, the top electrode, the bottom electrode, and piezoelectric thin films of the BAW element may be damaged in a manufacturing process. Furthermore, since a low melting point glass does not have sufficient strength, when the coefficient of thermal expansion of a BAW element substrate is different from that of the bond substrate, the strain generated cannot be absorbed. On the other hand, when cream solder is used for the sealing member (corresponding to the sealing frame), problems similar to those described in Japanese Unexamined Patent Application Publication Nos. 4-293310 and 2000-77970 occur during printing.

In Japanese Unexamined Patent Application Publication No. 2001-68580, a BAW filter is disclosed in which a microcap (corresponding to the bond substrate), which is provided with a gasket (corresponding to the sealing frame) and which is used to provide a vibration portion, is bonded to a BAW element by cold pressure bonding so as to provide a vibration space and a hermetic seal. In the case described above, the gasket (corresponding to the sealing frame) is formed of gold.

As described above, according to Japanese Unexamined Patent Application Publication No. 2001-68580, the microcap (corresponding to the bond substrate) provided with the gasket (corresponding to the sealing frame) is bonded to the BAW element by cold pressure bonding. In cold pressure bonding, since considerable pressure is applied to the BAW element, problems may arise in that the vibration portion of the BAW element is destroyed or a BAW element substrate is damaged by the pressure. In addition, when the degree of flatness of the BAW element substrate is not high, it is difficult to achieve sealing by cold pressure bonding, and the yield is thus decreased. Furthermore, when a very small amount of dust is present on the BAW element substrate, it becomes difficult to uniformly apply pressure on the periphery of the substrate, and in the worst case, the wafer may be broken.

SUMMARY OF THE INVENTION

To overcome the problems described above, preferred embodiments of the present invention provide a method of manufacturing an electronic device, in which bumps and a sealing frame are formed with high accuracy, and in which reliable bonding and sealing properties are obtained.

In accordance with one preferred embodiment of the present invention, a method for manufacturing an electronic device which includes an electronic element having a functional portion and terminal electrodes on a primary surface thereof, and a bond substrate having bond electrodes, which correspond to the terminal electrodes, on a primary surface of the bond substrate, the primary surface of the electronic element facing the primary surface of the bond substrate, the terminal electrodes of the electronic element being bonded to the bond electrodes of the bond substrate via bumps provided therebetween for electrical conduction, the electronic element being bonded to the bond substrate with a sealing frame provided therebetween, the sealing frame surrounding the functional portion and the bumps, thereby the functional portion and the bumps are hermetically sealed, the method includes the steps of forming a first resist pattern on one of the primary surfaces of the electronic element and the bond substrate, the first resist pattern having openings at locations corresponding to those at which the bumps and the sealing frame are to be formed, sequentially forming metals over the first resist pattern, the metals being formed into at least one adhesion layer, at least one barrier metal layer, and at least one solder layer, removing the first resist pattern such that the bumps and the sealing frame are simultaneously formed on the one of the primary surfaces of the electronic element and the bond substrate, forming a metal layer, which faces the sealing frame, on the primary surface other than the one of the primary surfaces of the electronic element and the bond substrate, and bonding the electronic element and the bond substrate to each other with the bumps and the sealing frame provided therebetween, in which the solder layer is heated such that metals forming the solder layer are alloyed or the solder layer is alloyed with a metal layer adjacent thereto for forming metal bonding.

In preferred embodiments of the present invention, since the bumps and the sealing frame are formed on the electronic element or the bond substrate by a deposition method instead of a printing method, a finer sealing frame is achieved, and in addition, variations in the height of the bumps and the sealing frame are greatly reduced, thereby forming the bumps and the sealing frame with greatly improved accuracy. In addition, problems such as degradation in performance or wafer breakage are prevented. Furthermore, since the bumps and the sealing frame are formed at the same time, the number of steps is greatly decreased.

In addition, since the solder sealing frame is directly formed on the electronic element or the bond substrate without forming an electrode such as a seal ring beforehand, the width of the solder sealing frame is minimized, and hence the size of the element or the substrate is greatly reduced.

The bump and the sealing frame each preferably have a three-layered structure including the adhesion layer, the barrier metal layer, and the solder layer. The adhesion layer ensures adhesion to the electronic element or to the bond substrate and is preferably formed using Ti, NiCr, Cr, or other suitable material. The barrier metal layer primarily prevents the metal forming the adhesion layer or a metal forming an electrode used as an underlying layer from diffusing into the solder layer (hereinafter referred to as "solder consumption") and is preferably formed of Cu, Ni, Pt, Pd, Ti, an alloy of the metal mentioned above, or a laminate formed thereof.

The solder layer is preferably formed of Sn as a primary component and is melted by heating during bonding to form a high melting point alloy, such as CuSn, SnAg, AuSn, or NiSn, from metals forming the solder layer or from the solder layer and a metal layer located adjacent thereto. Accordingly, when the electronic device is mounted on a mother board, the metal forming the bumps or the sealing frame is not remelted. In addition, by forming the alloy, properties such as corrosion resistance and abrasion resistance, which cannot be obtained by a single metal, are obtained. Since the temperature during bonding is decreased as compared to that for Au to Au bonding or to that for bonding performed by a low melting point metal, degradation of performance of the electronic element caused by high temperature is prevented.

As disclosed in Japanese Unexamined Patent Application Publication No. 9-162690, when Au and Au are bonded to each other, metal bonding between Au and Au only is obtained, and an alloy having different properties is not formed. On the other hand, according to preferred embodiments of the present invention, an alloy having superior properties, which are different from those obtained by a single metal, are advantageously obtained. Hence, reliable bonding and sealing properties are obtained.

Since the metal layer having a three-layered structure is formed by a deposition method, such as sputtering, CVD, or plating, stable bumps and sealing frame are formed without damaging the electronic element and the bond substrate.

When the solder layer is deposited, a stress generated in film formation is greatly reduced as compared to that of Au, the deformation of a lift-off resist pattern is greatly reduced, and hence the deviation of patterns for the bumps and the sealing frame is greatly decreased. That is, the bumps and the sealing frame are formed with high accuracy.

The bump is formed on the terminal electrode or the bond electrode. However, it is not necessary that the entire bump be provided on the electrode, and when a portion of the bump is in contact with the electrode, electrical conduction is obtained and the adhesion between the bump and the electronic element or the bond substrate is also obtained. In addition, a portion of the sealing frame may be in contact with the electrode.

According to a second preferred embodiment of the present invention, in the method for manufacturing an electronic device described above, the step of forming the metals layer, which face the sealing frame, on the primary surface other than the one of the primary surfaces of the electronic element and the bond substrate, preferably includes forming a second resist pattern on the primary surface, the second resist pattern having openings at positions corresponding to those at which the bumps and the sealing frame are to be formed, sequentially forming metals over the second resist pattern, the metals including at least one adhesion layer, at least one barrier metal layer, and at least one solder layer, and a step of removing the second resist pattern such that the metal layer used as a sealing frame is formed on the primary surface together with bumps.

That is, in addition to the bumps and the sealing frame formed on the one of the primary surfaces of the electronic element and the bond substrate, the bumps and the sealing frame are simultaneously formed on the primary surface other than the one of the primary surfaces by processing the metal layers each including the adhesion layer, the barrier metal layer, and the solder layer by a lift-off technique so as to face the bumps and the sealing frame on the one of the primary surfaces. Hence, when bonding the electronic element and the bond substrate to each other, since the two solder layers provided on both sides are melted together, stable metal bonding is obtained.

According to a third preferred embodiment of the present invention, in the method for manufacturing an electronic device according to the second preferred embodiment of the present invention, when the bumps and the sealing frame are formed on both the electronic element and the bond substrate, the width of the sealing frame formed on the primary surface of the electronic element is preferably different from that of the sealing frame formed on the primary surface of the bond substrate, and the thickness of the barrier metal layer forming the sealing frame which has a smaller width is preferably larger than that of the barrier metal layer forming the sealing frame which has a larger width.

When the electronic element and the bond substrate are bonded to each other, by a bonding load, excess solder may flow out. When this flow-out occurs, since a blade used in a subsequent dicing step is unevenly abraded, chipping may occur and/or short-circuiting may occur between the sealing frame and the bumps or among the sealing frame, the bumps, the top electrodes, and the bottom electrodes, resulting in degradation of performance.

Accordingly, in order to suppress the flow-out of the solder, the thickness of the barrier metal layer provided on one of the electronic element and the bond substrate is increased, and the width of the sealing frame provided on the other one of the electronic element and the bond substrate is increased. Since the thick barrier metal layer is not melted during bonding, the thick barrier metal layer defines a spacer. In addition, even when the thickness of the bond metal layer is decreased such that excess solder flows out, the solder only wets the upper surface of the electrode having a larger width and flows thereon, and the difference in wettability prevents the solder from flowing out from the electrode having a larger width. Since the flow-out of the solder is controlled as described above, shapes formed by bonding are uniform, and as a result, the yield of sealing is greatly improved.

According to a fourth preferred of the present invention, in the method for manufacturing an electronic device described above, it is preferable that the solder layer includes Sn as a primary component and at least one metal selected from the group consisting of Au, Ag, Cu, Zn, Si, Ge, Pb, In, Bi, and Sb, that the at least two metals which form the solder layer be deposited to form a layered structure, and that the solder layer having the layered structure including the at least two metals be alloyed by heating.

Although the solder layer may be formed of one metal such as Sn, due to cold brittleness thereof, the crystal collapses in an atmosphere at a temperature of not more than about 0° C. Accordingly, when the solder layer is formed using a plurality of metals to have a multilayer structure, a solder alloy is obtained during bonding, and thus, the problems caused by a single metal composition are eliminated without performing any complicated process such as alloy deposition.

In addition, by performing the bonding at the same time that a solder alloy is obtained, a portion of a metal is dissolved in the solder such that a fresh surface of the solder is exposed, and thus, the electrode (or metal layer) facing the solder may have wettability thereto, thereby providing superior solder bonding and sealing.

According to a fifth preferred embodiment of the present invention, in the method for manufacturing an electronic device described above, the solder layer preferably includes Sn, the barrier metal layer preferably includes one of Au, Ag, Ni, and Cu, and the solder layer is preferably alloyed with a portion of the metal forming the barrier metal layer by heating the solder layer.

Although there may be various methods for alloying the solder layer with another metal layer, when the solder layer is alloyed with a portion of the barrier metal layer provided thereunder, an Sn alloy is formed, and as a result, in addition to superior properties, such as heat resistance and corrosion resistance, strong bonding between the solder layer and the barrier metal layer is obtained.

According to a sixth preferred of the present invention, in the method for manufacturing an electronic device described above, the electrodes and the metal layer facing the bumps and the sealing frame, respectively, preferably have surface portions each including one metal selected from the group consisting of Au, Ag, Ni, and Cu, and the solder layers are preferably alloyed with the metal of the surface portions of the electrodes and the metal layer, which face the solder layers, by heating the solder layers.

During bonding of the electronic element to the bond substrate, the solder layers forming the top layers of the bumps and the sealing frame are brought into contact with the electrodes and the metal layer, respectively, followed by heating, and hence the solder layers are melted. In this step, the solder layers are alloyed with the metal, such as Au, Ag, Ni, or Cu, provided in the surface portions of the electrodes and the metal layer, and as a result, metal bonding is performed.

Accordingly, an alloy having superior heat resistance and corrosion resistance is formed from the metals forming the solder layer, and in addition, reliable metal bonding between the solder layers and the respective electrodes and metal layer is achieved, thereby forming a CSP electronic device having superior electrical and mechanical properties.

As has been thus described, according to preferred embodiments of the present invention, the bumps and the sealing frame are simultaneously formed on at least one of the electronic element and the bond substrate, fine and accurate sealing frame and bumps are formed. In addition, since the solder sealing frame is directly formed on the electronic element or the bond substrate without forming an electrode such as a seal ring beforehand, the manufacturing process is greatly simplified, the positioning is easily performed, the width of the sealing frame is minimized in the range in which the function thereof is obtained, and as a result, the size of the electronic device is greatly reduced.

The bumps and the sealing frame each have a three-layered structure including of the adhesion layer, the barrier metal layer, and the solder layer, the adhesion layer ensures adhesion with the electronic element or the bond substrate, and in addition, the barrier metal prevents so-called solder consumption caused by the adhesion layer, thereby decreasing bonding defects and sealing defects.

Furthermore, by heating and melting the solder layer during bonding, since the solder layer is alloyed with the metal adjacent thereto, superior properties, which cannot be realized by a solder layer including a single component, are obtained, and thus, a reliably sealed electronic device is obtained. In addition, since the bonding temperature is decreased as compared to that for Au to Au bonding or for bonding performed by a low melting point glass, degradation of performance of an electronic element caused by high temperature is effectively prevented.

The above and other elements, characteristics, features, steps and advantages of the present invention will become clear from the following description of preferred embodiments taken in conjunction with the accompanying drawings.

BRIEF DESCRIPTION OF THE DRAWINGS

FIGS. 6A and 6B are enlarged cross-sectional views showing a bump and a sealing frame provided on a SAW element and a bond electrode provided on a substrate before and after being bonded to each other;

DETAILED DESCRIPTION OF THE PREFERRED EMBODIMENTS

Hereinafter, preferred embodiments of the present invention will be described with reference to the figures.

First Preferred Embodiment

Figure 1:
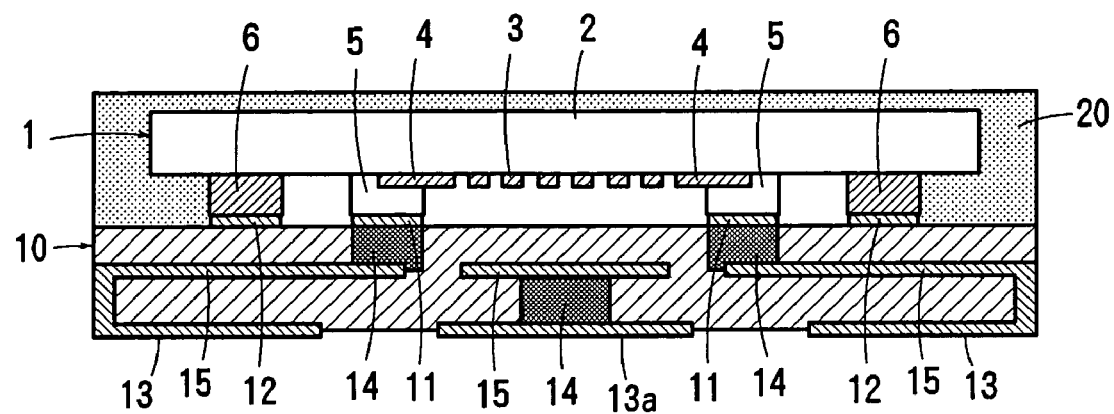
FIG. 1 is a cross-sectional view of a surface acoustic wave device which is an example of an electronic device of the present invention.
Figure 2:
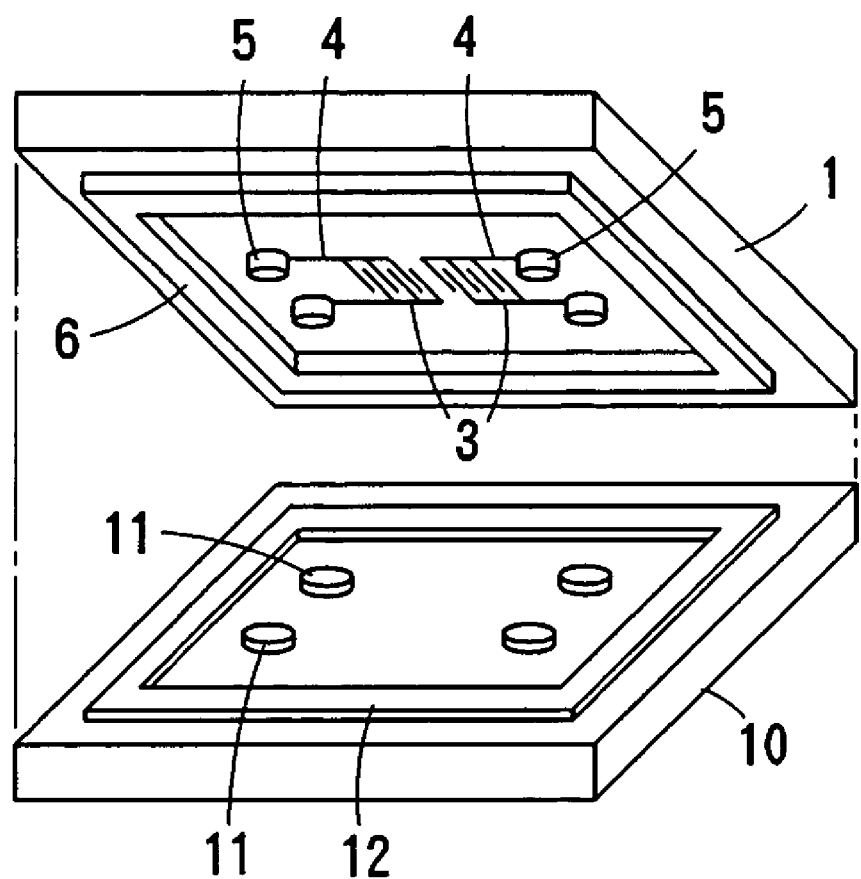
FIG. 2 is an exploded perspective view of the surface acoustic wave device shown in FIG. 1.

FIGS. 1 and 2 each show a surface acoustic wave device according to a first preferred embodiment of an electronic device of the present invention. The surface acoustic wave device includes a surface acoustic wave element (hereinafter referred to as a "SAW element") 1, a bond substrate 10, and a resin 20 coating the periphery of the SAW element 1.

The SAW element 1 includes a substrate 2 made, for example, of quartz, $LiTaO_3$, $LiNbO_3$, or $LiB_4O_7$, having piezoelectric properties, and on one primary surface of the substrate 2, comb-shaped IDT electrodes 3 are provided, terminal electrodes 4 for electrical conduction around the peripheries thereof, solder bumps 5, portions or the entireties of which are provided on the terminal electrodes 4, and a solder sealing frame 6 arranged so as to surround the bumps 5 and IDT electrodes 3. In this example, the width and the thickness of the solder sealing frame 6 are about 70 μm and about 20 μm, respectively, and the diameter and the thickness of the bump 5 are about 70 μm and about 20 μm, respectively. This thickness is determined such that irregularities of the electrode to be bonded were absorbed and damage done thereto caused by thermal shock fatigue is avoided. In addition, in view of forming accuracy of the electrodes formed at a side of the bond substrate 10 and alignment accuracy obtained in flip-chip mounting, the bump diameter and the sealing width, which were about 70 μm each, were determined such that reliable bonding is achieved.

The bond substrate 10 is a multilayer ceramic substrate, and on the top surface thereof, bump-bond electrodes 11 for bonding the bumps 5 and a sealing frame-bond electrode 12 for bonding the solder sealing frame 6 are provided. In this example, the bump-bond electrode 11 has a substantially circular shape having a diameter of about 70 μm, and the sealing frame-bond electrode 12 has a substantially rectangular shape having a width of about 70 μm. On the bottom surface of the bond substrate 10, external electrodes 13 are provided for SMT connection with a mother board, and the bond electrodes 11 are connected to the external electrodes 13 through a via electrode 14 and interlayer wires 15. In order to maintain electrical properties, the sealing frame-bond electrode 12, which is to be bonded to the solder sealing frame 6, is connected to an external electrode 13a for grounding through the via electrodes 14 or the interlayer wire 15. In view of solder mounting properties, the bond electrodes 11 and 12 and the external electrodes 13 are preferably formed by performing electroless plating on the surfaces of the electrodes of the bond substrate 10 to form an approximately 2 μm-thick nickel layer, followed by performing electroless plating to form an approximately 0.5 μm thick gold layer. The bond substrate 10 shown in FIG. 1 includes two ceramic substrates laminated to each other. However, the bond substrate may be formed of a single layer or at least three layers, and in addition, a resin or glass may be used as a material instead of a ceramic. In addition, a multifunctional module may be formed by mounting a plurality of the SAW elements 1, forming passive elements such as L, C, and R in the multilayer ceramic substrate 10, or mounting other surface mounting elements on regions of the multilayer ceramic substrate 10 other than those on which the SAW elements 1 are mounted.

The bumps 5 and the sealing frame 6 provided on the SAW element 1 are bonded to the bond substrate 10 via solder, and the SAW element 1 is flip-chip bonded to the bond substrate 10. A hollow portion is formed by the thickness of the solder sealing frame 6, and electrical conduction is also provided by the solder bumps 5. Furthermore, the solder sealing frame 6, the SAW element 1, and the bond substrate 10 provide a hermetic seal which protects the IDT electrodes 3.

On the SAW element 1 which is solder bonded and sealed, since a resin 20 is applied, the hermetic seal is more reliable, and the bonding strength between the SAW element 1 and the bond substrate 10 is greatly improved. As the coating resin 20, a UV curable resin is preferably used in this preferred embodiment. The coating resin 20 is provided to prevent the SAW element 1 from being broken or chipped and is also used as a surface on which letters or other information relating to a product are to be printed. As the coating resin 20, epoxy resins, silicone resins, and polyimide resins may also be used. In addition, when electromagnetic shield is required, the coating resin 20 may be adhered to the solder sealing frame 6 with a conductive adhesive including conductive particles for grounding.

The SAW element 1 of the surface acoustic wave device described above is formed by the steps shown in FIG. 3.

Figure 3A:
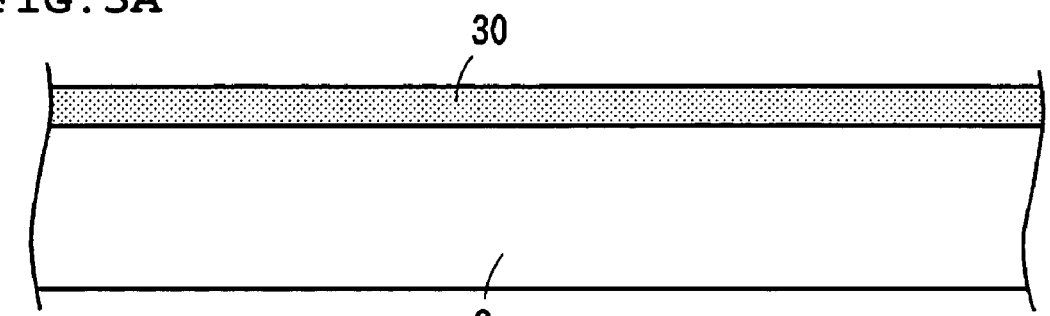
FIGS. 3A to 3D are views showing manufacturing steps of one example of a manufacturing method of a SAW element.

First, as shown in FIG. 3A, a photoresist 30 is applied over substantially the entire piezoelectric substrate 2 composed, for example, of quartz, $LiTaO_3$, $LiNbO_3$, or $LiB_4O_7$.

Figure 3B:
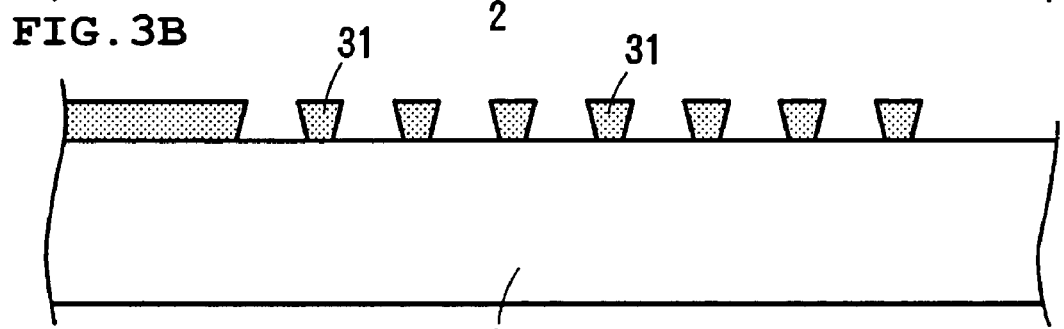

Next, as shown in FIG. 3B, by a photolithographic technique, exposure and development of the photoresist 30 are performed, thereby forming a lift-off resist pattern 31 in which openings are provided at locations at which the IDT electrodes 3, the terminal electrodes 4, and other elements are to be formed.

Figure 3C:
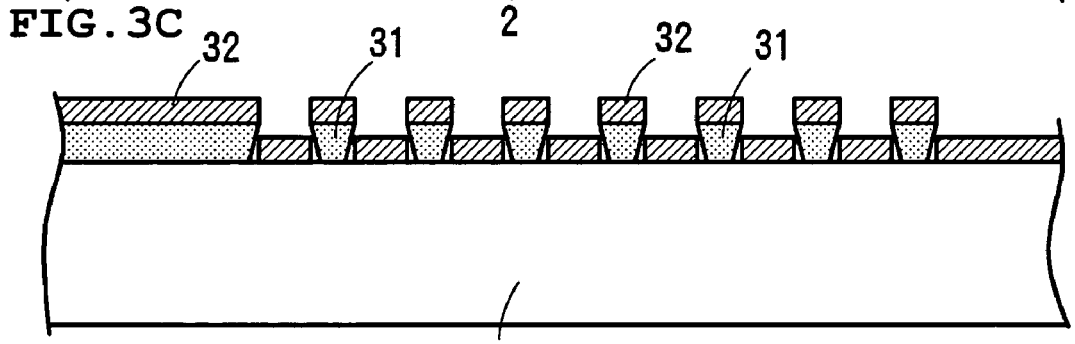

Subsequently, as shown in FIG. 3C, by deposition, sputtering, or other suitable method, an electrode film 32 is formed using an electrode material (Al) over the resist pattern 31.

Figure 3D:
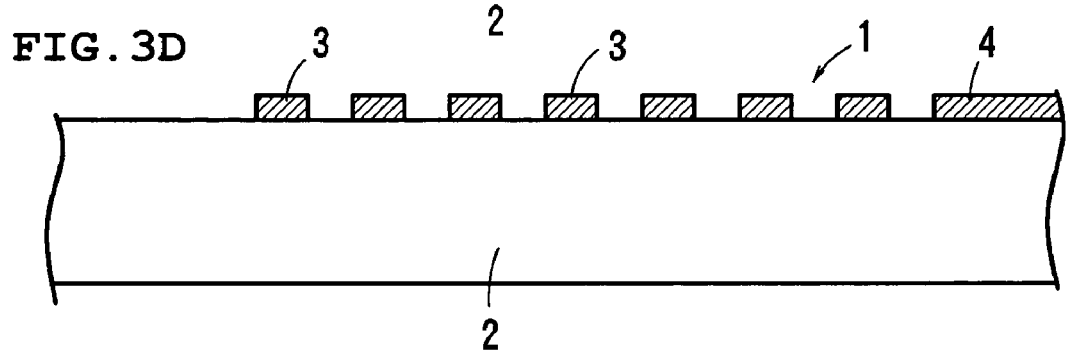

Next, as shown in FIG. 3D, by a lift-off technique, the resist pattern 31 and unnecessary electrode films 32 provided thereon are removed, thereby forming an electrode pattern including the IDT electrodes 3 and the terminal electrodes 4.

The method for forming the IDT electrodes 3 and the terminal electrodes 4 is not limited to a photolithographic process, and for example, an etching process including sequential steps of film formation, resist patterning, etching, and resist removal may also be used. In the process described above, in order to suppress corrosion of the IDT electrodes 3, a thin passivation film (composed, for example, of $SiO_2$ or SiN) may be provided as long as the film does not degrade the properties of the electrodes.

Next, a method for forming the bumps 5 and the sealing frame 6 on the SAW element 1 provided with the electrodes 3 and 4 as described above is shown in FIGS. 4A to 4E.

Figure 4A:
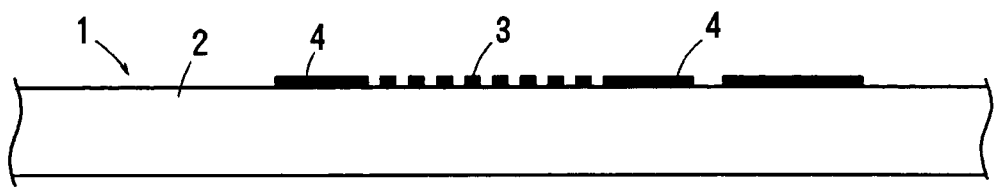
FIGS. 4A to 4E are views showing manufacturing steps of a method for forming bumps and a sealing frame on a SAW element.

FIG. 4A shows the SAW element 1 provided with the pattern of the IDT electrodes 3, which are formed by the method shown in FIGS. 3A to 3D.

Figure 4B:
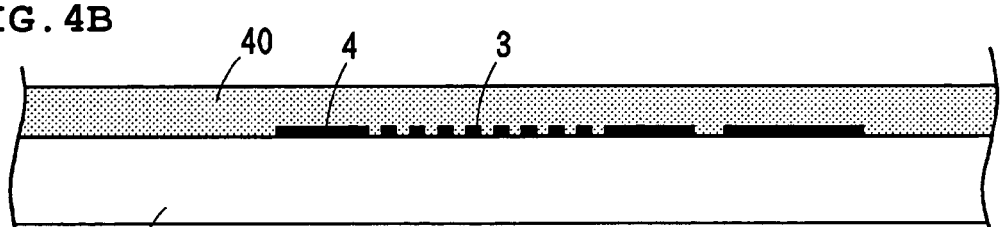

First, as shown in FIG. 4B, a negative photoresist 40 used for lift-off is applied onto substantially the entire SAW element 1 provided with the pattern of the IDT electrodes 3. The coating thickness of the resist is, for example, about 50 μm so as to be greater than the total thickness of three metal layers 42 to 44 described later.

Figure 4C:
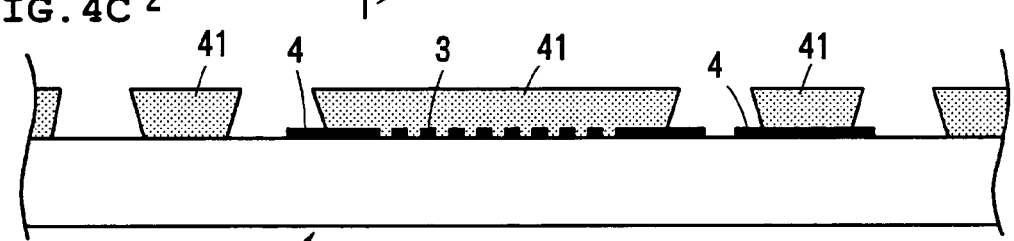

Next, the photoresist 40 is exposed using a photomask such that portions at which the bumps 5 and the sealing frame 6 are to be formed are shaded, and non-exposed areas are then removed (developed) using a developing solution. As a result, as shown in FIG. 4C, a negative resist pattern 41 is formed having openings at positions at which the bumps 5 and the sealing frame 6 are to be formed. In the step described above, photolithographic conditions are set such that each cross-section of the openings of the negative resist pattern 41 has an inverse tapered shape.

Figure 4D:
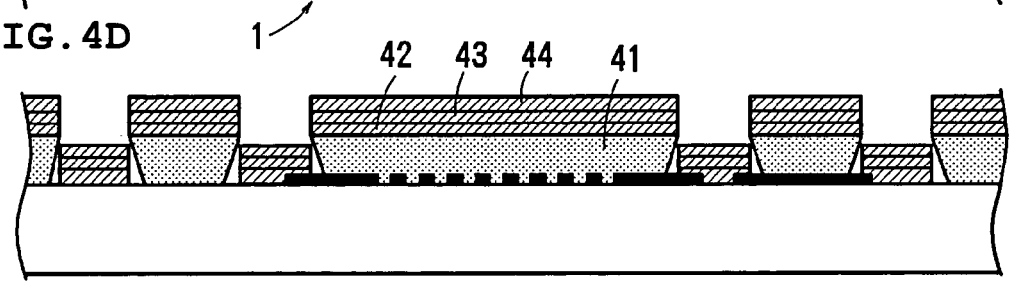
Figure 4E:
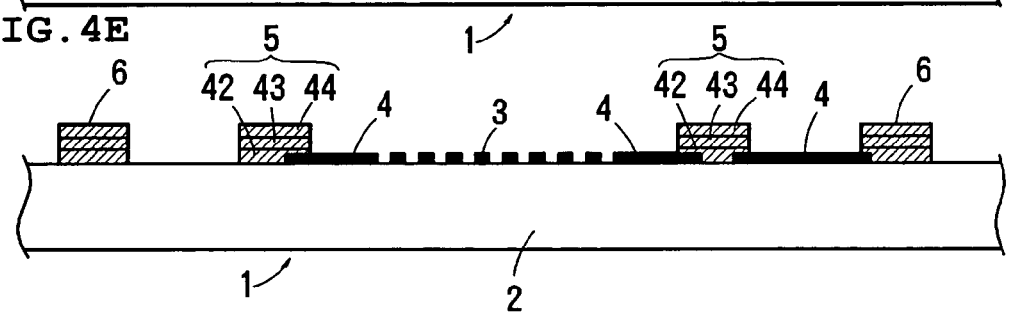

Subsequently, as shown in FIG. 4D, over the resist pattern 41, an adhesion layer 42, a barrier metal layer 43, and a solder layer 44 are sequentially formed by an electron beam deposition method. A Ti layer having a thickness of about 50 nm, an Ni layer having a thickness of about 1.2 μm, and a layer which includes Sn as a primary component and Cu and which has a thickness of about 20 μm are formed in that order as the adhesion layer 42, the barrier metal layer 43, and the solder layer 44, respectively. In this example, in order to ensure the adhesion between the films, the film formation was continuously performed for the above-described three layers such that no vacuum brake occurs. When Ti is used for the adhesion layer 42, and Ni is used for the barrier metal layer 43, the adhesion between the SAW element 1 and the piezoelectric substrate 2 is reliably obtained, adhesion defects caused by so-called solder consumption are prevented, and as a result, bonding defects and hermetic seal defects are greatly decreased. For the adhesion layer 42, in addition to Ti, Al, Ni, Cr, Cu, and an alloy thereof may be used. In addition, for the barrier metal layer 43, in addition to Ni, a material, such as Al, Cu, Pt, Pd, or an alloy primarily including the metals mentioned above, which functions as a diffusion blocking film for the solder layer 44, may be used. For the solder layer 44, in addition to an alloy containing Sn, a material such as a brazing alloy primarily composed of Pb or Au, which reliably bonds the bond substrate 10 to the electrode material, may be used.

Subsequently, the SAW element 1 is immersed in a stripping solution bath so as to remove unnecessary resist and the deposited films by a lift-off technique, and the SAW element 1 is further washed with water in order to remove the stripping solution. By the process described above, as shown in FIG. 4E, the SAW element 1 provided with the electrode patterns 3 and 4, the bumps 5, and the sealing frame 6 is obtained.

As described above, when the bumps 5 and the sealing frame 6 are formed by a lift-off deposition process, the bumps 5 and the sealing frame 6 are simultaneously formed and are miniaturized. Of course, this process is performed for a mother substrate (wafer) as is the case of a general SAW element. In addition, since the solder layer formation is performed by deposition, there is no significant increase in temperature of the wafer, and unlike conventional reflow performed after solder printing, rapid increases in temperature do not occur. Accordingly, problems such as wafer breakage are prevented. In addition, since a mechanical stress is not applied, the wafer is not broken at all.

A method for bonding the SAW element 1 and the bond substrate 10 thus formed will be described with reference to FIGS. 5A to 5F.

Figure 5A:
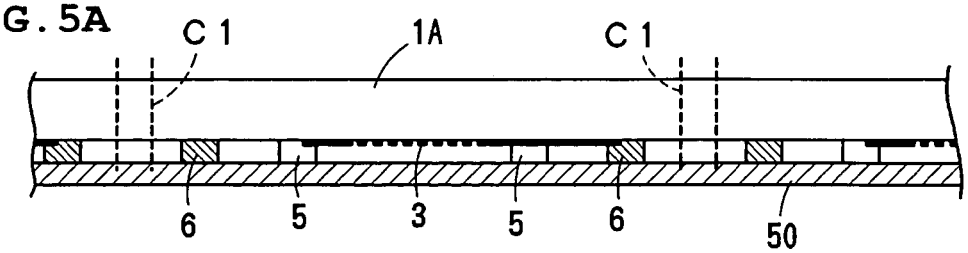
FIGS. 5A to 5F are views showing manufacturing steps of a method for bonding a SAW filter and a bond substrate to each other.

As shown in FIG. 5A, a SAW wafer 1A provided with the IDT electrodes 3, the terminal electrodes 4, the bumps 5, and the solder sealing frames 6 is adhered to an adhesive sheet 50. In this step, in order to prevent chips and blade powder generated in dicing from adhering to IDT electrodes 3, the SAW wafer 1A is adhered to the adhesive sheet 50 on the surface on which the solder sealing frames 6 are formed. After the adhesive sheet 50 is fixed, the SAW wafer 1A is separated into the individual SAW elements 1 by dicing along dotted lines C1 shown in FIG. 5A, and after chips and other contaminates are removed by washing with water, drying is performed.

Figure 5B:
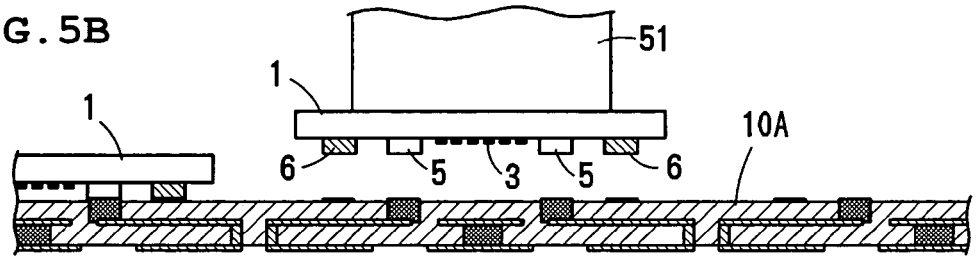

Next, as shown in FIG. 5B, after the rear side of each SAW element 1 adhered to the adhesive sheet 50 is chucked and picked up by a tool 51 so as to be removed from the adhesive sheet 50, the SAW element 1 is positioned such that the IDT electrodes 3, the bumps 5, and the sealing frame 6 face an alumina-made bond substrate 10A which is a mother substrate including a plurality of bond substrates, and the SAW element 1 is then preliminarily bonded to the bond substrate 10A by applying an ultrasonic wave having a frequency of about 60 kHz at a power of about 80 mW and a load of about 5 N for about 100 ms. This step is repeated a desired number of times such that a desired number of the SAW elements 1 are preliminarily bonded to the mother substrate 10A. In order to suppress the growth of an oxide film of the solder layer 44 and also to suppress so-called solder consumption thereof by the barrier metal layer 43, the step described above is performed without heating. However, when solder bonding can be performed without any problems, heating may be performed.

Figure 5C:
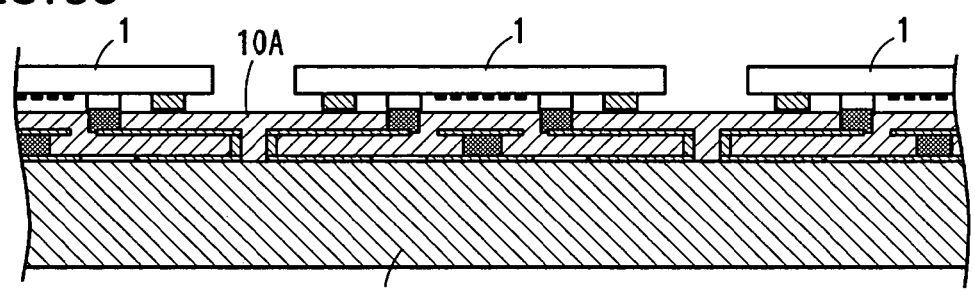

Subsequently, as shown in FIG. 5C, after the mother substrate 10A to which the SAW elements 1 are preliminarily bonded is placed on a hot plate 52, the solder layer 44 is melted without using flux by heating to about 260° C. in a nitrogen atmosphere containing oxygen at a concentration of about 100 ppm, followed by cooling to solidify the solder, thereby performing solder bonding and solder sealing. In order to prevent oxidation of the solder layer 44, the step described above is performed in a nitrogen atmosphere. However, the step may also be performed, for example, in vacuo, in plasma, in an inert gas, or in a reducing gas. In addition, the hot plate 52 is used as a heating device. However, a reflow furnace, an oven, and other suitable heating devices may also be used.

Figure 5D:
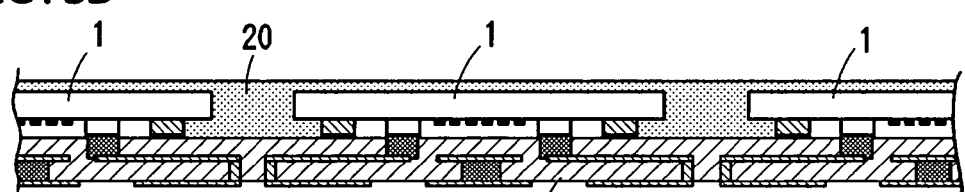

Next, as shown in FIG. 5D, onto the mother substrate 10A provided with a large number of the SAW elements 1 each of which is solder bonded and solder sealed, a UV curable resin (UV resin) 20 made of an epoxy resin is applied by screen printing and is then cured by UV radiation. The UV resin is used to suppress warping of the mother substrate 10A which occurs when a resin is cured. When an electromagnetic shield is required, carbon or fillers composed, for example, of Cu or Ag may be added to an epoxy resin.

Figure 5E:
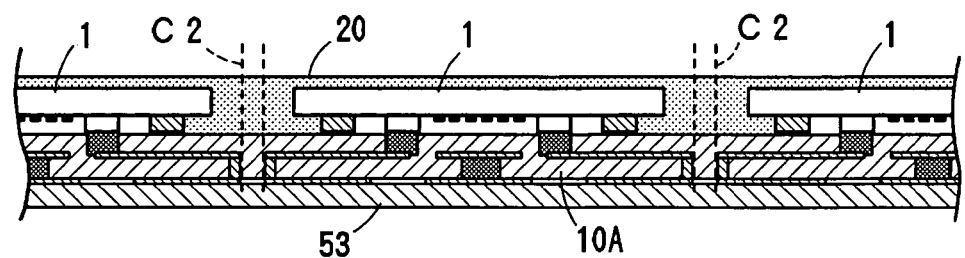
Figure 5F:
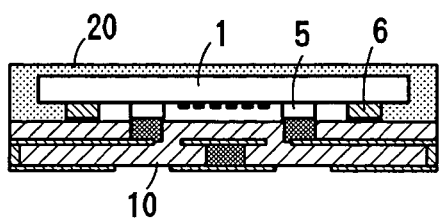

Subsequently, as shown in FIG. 5E, the mother substrate 10A covered with the cured resin is adhered to an adhesive sheet 53 and is then separated into the individual SAW devices by dicing along dotted lines C2. FIG. 5F shows the SAW device as a final product.

FIGS. 6A and 6B each show a particular example of metal layers which define the bump 5 and the sealing frame 6 provided for the SAW element 1 and metal layers which define the bond electrodes 11 and 12 of the bond substrate 10, and FIG. 6A shows the state before bonding and FIG. 6B shows the state after bonding.

In forming the bumps 5 and sealing frame 6, after the adhesive layer (Ti) 42 and the barrier metal layer (Ni) 43 are formed, an Ag layer that is about 0.5 µm thick, an Sn layer that is about 20 µm thick, and an Au layer that is about 0.1 µm thick are sequentially formed by deposition, thereby forming the solder layer 44 having a multilayer structure. As described above, the bond electrodes 11 and 12 of the bond substrate 10 are each preferably formed of an Ni layer provided on the wire electrode (composed, for example, of Cu) and an Au layer provided on the Ni layer.

When the bumps 5 and the sealing frame 6 are melted during bonding, the solder layer 44 is heated to a melting point of Sn of about 232° C. or more such that Ag is dissolved in Sn, thereby obtaining an SnAg solder alloy. Since Au is also dissolved in Sn simultaneously such that a fresh surface of the solder is exposed, the bond electrodes 11 and 12 of the bond substrate 10 have solder wettability, and thus, reliable solder bonding and solder sealing is obtained.

In addition, in the example described above, the solder alloy is obtained when the bumps 5 and the sealing frame 6 are melted and bonded. However, the solder alloy may be obtained by heating before bonding.

Bonding can be performed only by Sn. However, due to cold brittleness thereof, the crystal collapses in an atmosphere at a temperature of not more than about 0° C. Accordingly, the Ag layer is provided so as to form a composition that is similar to a eutectic composition. In addition, when Sn is present on the surface, surface oxidation may occur when the resist 40 is stripped away or when moisture is when dicing, and as a result, bonding defects may occur. Hence, the Au layer is provided on the Sn layer. However, the Au layer provided on the Sn surface may be omitted. Since a SnAg solder alloy is formed, fatigue resistance of the solder is greatly improved. When Cu is used for the barrier metal layer 43, a SnAgCu solder alloy is formed, and as a result, fatigue resistance is further improved.

In this example, the SnAg solder was used to improve fatigue resistance. However, when a device requires solder heat resistance, an AuSn alloy having a melting point of about 280° C. may be formed on the barrier metal 43 by the steps of depositing an Au layer which is about 12 µm thick, an Sn layer which is about 8 µm thick, and an Au layer which is about 0.2 µm thick, melting the Sn layer at about 250° C. for bonding, and then performing thermal annealing. According to this method, although a heat resistance temperature of the SAW element 1 is relatively low, such as about 300° C., a device in which a bonded portion has a relatively high solder heat resistance of about 280° C. or more is obtained.

When the solder layer 44 has a metal multilayer structure as described above, the following advantages are achieved.

Without performing alloy deposition in which the control thereof may not be easily performed, variations in alloy composition increase, and a gradient composition is formed, a solder alloy is easily obtained by depositing metals separately, followed by heating performed in mounting.

A bonded portion is easily formed using SnAg solder or SnAgCu solder which has improved fatigue resistance.

Bonding of AuSn solder having solder heat resistance is performed at about 240° C., which is not less than the melting point of Sn and not more than the melting point of AuSn, so as to prevent the SAW element from being damaged, and bonded and sealed portions have solder heat resistance.

Second Preferred Embodiment

Next, as an electronic device, a BAW filter according to another preferred embodiment of the present invention will be described.

Figure 7A:
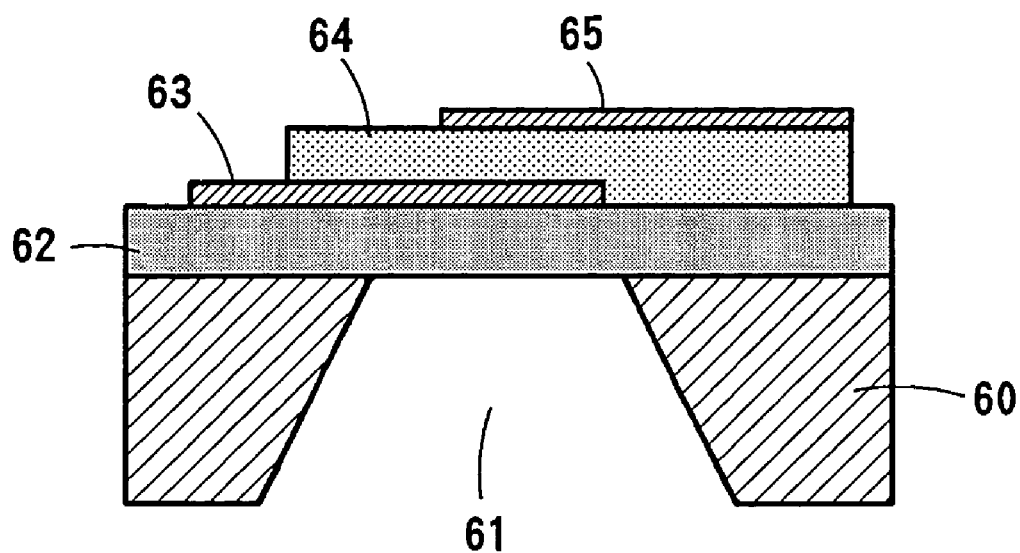
FIGS. 7A and 7B are views each showing a basic structure of a piezoelectric thin film resonator.
Figure 7B:
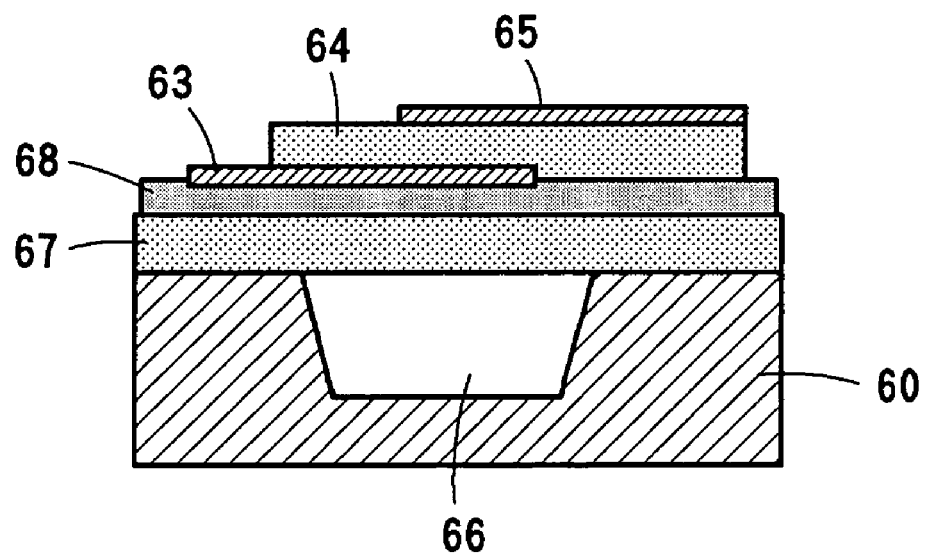

The basic structure of a piezoelectric thin film resonator is shown in FIGS. 7A and 7B. As shown in FIG. 7A, an opening 61 is provided in an Si substrate 60, and after an insulating film (composed, for example, of $SiO_2$) 62 is provided over the opening 61, a bottom electrode 63, a piezoelectric thin film 64, and a top electrode 65 are formed on the insulating layer 62 in that order. In addition, as shown in FIG. 7B, a concave portion 66 is provided in the Si substrate 60, and after two insulating layers (composed, for example, of $SiO_2$ and $Al_2O_3$) 67 and 68 are provided over the concave portion 66, the bottom electrode 63, the piezoelectric thin film 64, and the top electrode 65 are preferably formed on the insulating layer in that order. The electrodes 63 and 65 are preferably formed using Al, Ta, Nb, Mo, Pt, or W, and the piezoelectric thin film 64 is preferably formed using ZnO or AlN.

In both piezoelectric thin film resonators in FIGS. 7A and 7B, a vibration portion defined by the bottom electrode 63, the piezoelectric thin film 64, the top electrode 65, and the insulating film 62 has a diaphragm structure provided over the opening 61 or the concave portion 66 provided in the Si substrate 60. By applying an electrical signal between the top and the bottom electrodes 63 and 64, the piezoelectric thin film 64 resonates (vertical vibration) so as to excite a bulk wave, and the vibration properties thereof are used. A plurality of piezoelectric resonators is arranged in a ladder pattern or in a lattice pattern to define a piezoelectric filter. When moisture adheres to or is adsorbed in the electrodes 63 and 65 and/or the piezoelectric thin film 64, due to increase in weight or corrosion of the electrodes, resonant properties are changed, and as a result, the performance is deteriorated. Accordingly, a hermetically sealed package is required.

Figure 8:
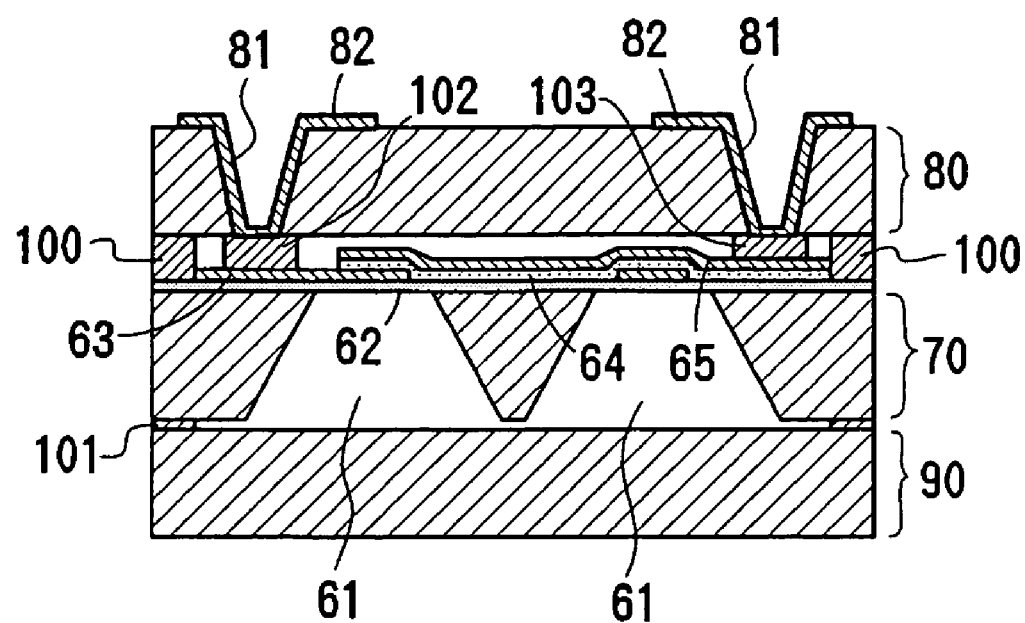
FIG. 8 is a view showing a piezoelectric filter provided with a hermetically sealed piezoelectric thin film resonator.

As shown in FIG. 8, a hermetically sealed package includes a piezoelectric filter (BAW element) 70 including a plurality of piezoelectric thin film resonators, a surface bond substrate 80 in which external electrodes 82 and through holes (bond electrodes) 81 are provided to electrically connect the electrodes of the BAW element 70 to electrodes provided outside the package, and a rear surface bond substrate 90 which seals the opening 61 of the BAW element 70. When the BAW element has the concave portion (see FIG. 7B), the rear surface bond substrate is not required. The surface bond substrate 80 and the BAW element 70 are metal-bonded (solder-bonded) with a solder sealing frame 100, the rear surface bond substrate 90 and the BAW element 70 are metal-bonded (solder-bonded) with a solder sealing frame 101, and thus, a hollow portion is provided and is sealed such that the vibration portion operates. In addition, the electrodes 63 and 65 of the BAW element 70 are metal-bonded (solder-bonded) to the through holes 81 provided in the surface bond substrate 80 via solder bumps 102 and 103, respectively, and are electrically connected to the external electrodes 82. In this case, instead of the thin film electrodes provided in the through holes 81, conductive paste may be filled therein.

In this example, a hard glass having a coefficient of thermal expansion similar to that of the Si substrate for the BAW element 70 is used for the surface bond substrate 80 and the rear surface bond substrate 90. In addition, Cu, which has high conductivity, is used for the wire layers 81 and 82 of the surface bond substrate 80. In addition to Cu, the wire layers may be formed, for example, of Al or an alloy primarily composed of Al. As the solder sealing frame and the bumps, a bond metal layer having a multilayer structure is used. In this bond metal layer, Ti, Cu, and a CuSn alloy are used for the adhesion layer, the barrier layer, and the bond layer, respectively. In addition, the composition of the CuSn alloy includes $Cu_3Sn$ as a primary component.

The adhesion layer of the bond metal layer is formed of a metal, such as NiCr or Cr. The barrier layer prevents metals of the adhesion layer or terminal portions from diffusing into the solder layer and preferably is made of Ni, Pt, Pd, an alloy thereof, or a laminate thereof. A CuSn alloy composition other than $Cu_3Sn$ may also be used for the bond layer, and in addition, SnAg or an alloy primarily including AlSn or NiSn, which are described in the example of the SAW filter, may also be used. In addition, in order to ensure the hollow portion, a concave portion corresponding thereto may be provided in a hard glass.

A method for manufacturing a sealed package as described above will be described. First, methods for forming the surface bond substrate 80, the rear surface bond substrate 90, and the BAW element 70 will be described, and subsequently, a bonding method thereof for forming a sealed package will be described.

(1) Surface Bond Substrate

Figure 9:
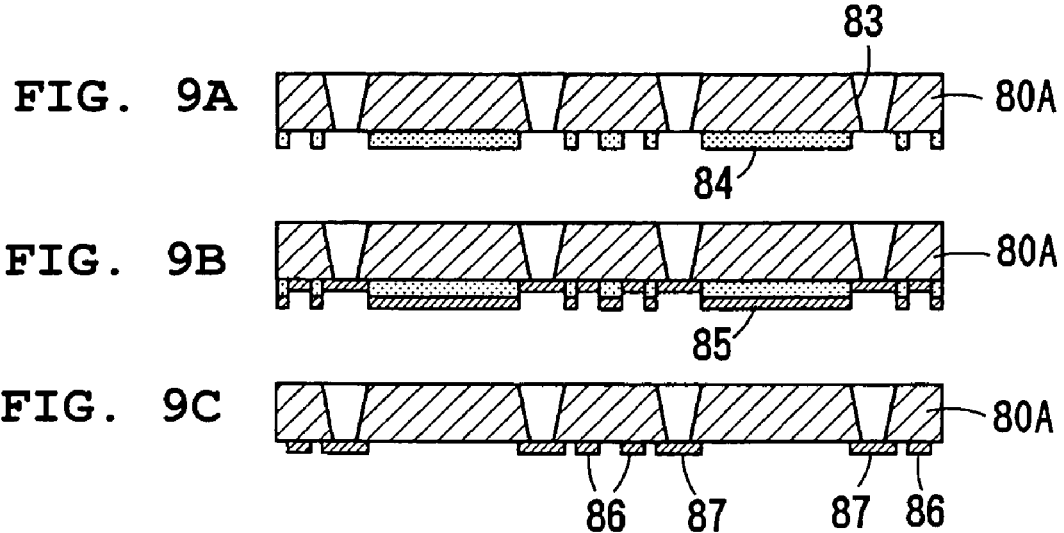
FIGS. 9A to 9C are views showing manufacturing steps of forming a surface bond substrate.

First, as shown in FIG. 9A, through holes 81 are formed in the surface bond substrate 80. Accordingly, after a resist pattern for sand blasting is formed by a photolithographic technique on a hard glass wafer 80A defining a mother substrate which includes a plurality of surface bond substrates, a plurality of penetrating holes (having a diameter of about 0.05 mm) 83 is formed, and the resist pattern is then removed. Next, metal films are sequentially formed on the hard glass wafer and in the penetrating holes 83 by sputtering so as to form a Ti layer (adhesion layer) and a Cu layer in that order, thereby forming the through holes 81 and the external electrodes 82 for the individual surface bond substrates 80. In this example, the hard glass wafer 80A was preferably used. However, as long as a coefficient of thermal expansion is similar to that of the Si wafer for the BAW element 70, insulating properties, and low humidity permeability, a ceramic substrate or an Si wafer provided with an insulating film may also be used.

Next, in order to form the solder sealing frame and the bumps, a resist pattern 84 is formed on the hard glass wafer 80A. Onto the hard glass wafer 80A provided with the through holes 81 and the external electrodes 82, two types of lift-off resists are applied to form a layered film, and by a photolithographic technique, a pattern for contact portions (bond electrodes) for the through holes is formed together with a pattern for the solder sealing frame. The resist layer at the glass wafer 80A side is formed of a resist having good strippability, and a resist having high strength is provided thereon. Since an acrylic resist is used as the upper resist, a lift-off resist pattern is formed which has resistances against stress of a metal thin film formed thereon and against heat generated in film formation, and since a resist layer having good strippability is formed under the acrylic resist described above, the strippability is also improved. Accordingly, resist residue is prevented. As a result, a film made of Sn or Au, which has a high stress and which significantly increases the film formation temperature, can be used. In addition, since the formation is performed using a photolithographic technique, highly accurate line width and alignment is achieved, and in addition, the lift-off pattern can be formed over substantially the entire wafer surface at one time. In this example, the resists are formed at the periphery of the element such that the solder sealing frame, which is formed in a subsequent step, has a width of about 30 μm. This width provides the required bond strength.

Next, as shown in FIG. 9B, by electron beam deposition, a metal layer 85 composed of Sn (about 4.5 μm thick), Cu (about 4.5 μm thick), and Ti (about 0.1 μm thick) in that order from top to bottom is formed. The metal layer 85 described above may be formed by a plating process or a sputtering process. In this metal film 85, Cu defines a barrier layer and a bond layer since a portion of Cu is diffused and dissolved in the Sn layer to form an alloy when the Sn is melted. By controlling the thicknesses of the Sn film and the Cu film and the bonding temperature profile, the composition obtained after the bonding is accurately controlled. In this step, instead of Cu, a general material having a barrier effect, such as Pt, Pd, or Ni, may also be used. In addition, Ti is used as the adhesion layer, but a metal such as NiCr or Cr may also be used.

Next, as shown in FIG. 9C, the resist pattern 84 is removed (lift-off) using a stripping solution, thereby forming a solder sealing frame 86 and bumps 87 which have a multilayer structure composed of Sn, Cu, and Ti. In this example, the hollow portion was ensured by the thickness of the solder sealing frame 86. However, a concave portion may be formed in the surface bond substrate 80 at a location facing the vibration portion of the BAW element 70 by sand blasting or etching, and the thickness of the solder sealing frame may be decreased. In addition, in this example, the solder sealing frame and the bumps were preferably formed at the same time. However, they may be separately formed.

(2) Rear Surface Bond Substrate

Figure 10:
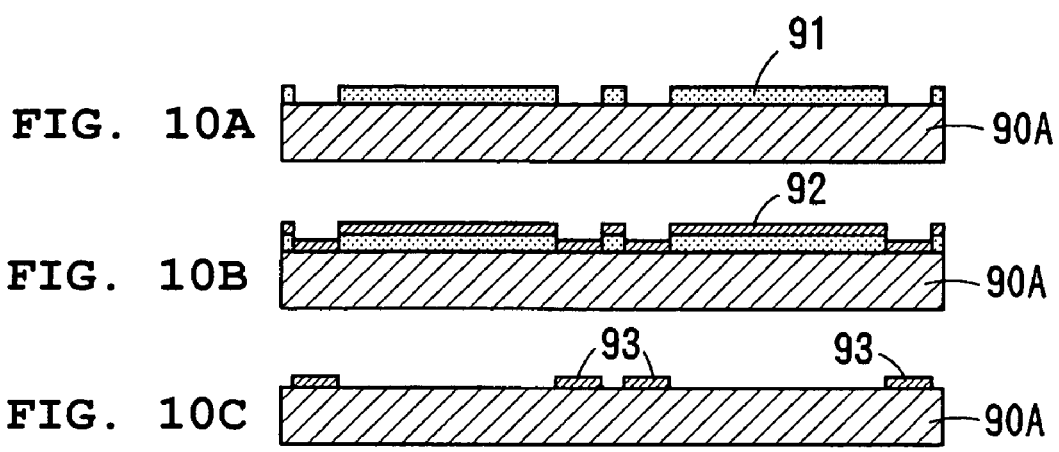
FIGS. 10A to 10C are views showing manufacturing steps of forming a rear surface bond substrate.

As shown in FIGS. 10A to 10C, by the same process as that for the surface bond substrate 80, solder sealing frames 93, having a multilayer structure composed of Sn, Cu, and Ti, for the rear surface bond substrates 90 are formed by the steps of forming a lift-off resist pattern 91 on a hard glass wafer 90A, forming a film 92 composed of Sn (about 4.5 µm thick), Cu (about 4.5 µm thick), and Ti (about 0.1 µm thick) by electron beam deposition, and then performing lift-off.

In this step, the formation of the metal film may also be performed by an etching process or a sputtering process. In addition, in this example, the hard glass was used. However, as long as a coefficient of thermal expansion is similar to that of the Si wafer used for the BAW element, a metal such as a 42 alloy, a ceramic, or a Si wafer may also be used.

(3) BAW Element

Figure 11:
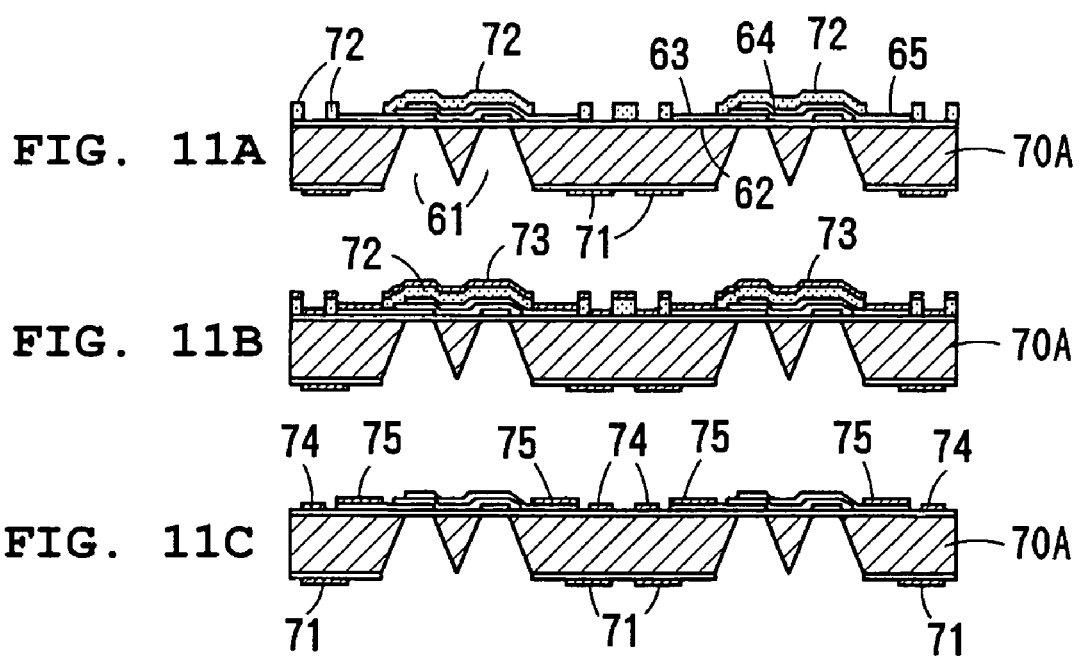
FIGS. 11A to 11C are views showing manufacturing steps of forming a BAW element.

As shown in FIG. 11A, the openings 61 are formed in an Si wafer 70A, by anisotropic etching, followed by forming the insulating film 62 so as to cover the openings 61, and on the insulating film 62, the top electrodes 65 (Al/Ti), the piezoelectric films 64 (ZnO), and the bottom electrodes 63 (Al/Ti) are formed, thereby forming a piezoelectric filter element (BAW element) in which a plurality of piezoelectric thin film resonators are arranged in a ladder pattern. The insulating film 62, the top electrode 65, the piezoelectric thin film 64, and the bottom electrode 63 are preferably formed using film-forming techniques such as photolithography, deposition, and sputtering.

As shown in FIG. 11A, on the rear surface of the Si wafer 70A, a sealing frame 71 having a multilayer structure composed of Sn (about 0.5 µm thick), Cu (about 3.0 µm thick), and Ti (about 0.1 µm thick) is formed by electron beam deposition so as to face the solder sealing layer 93 of the glass wafer 90A of the rear surface bond substrate. The formation of the sealing frame 71 may also be performed by plating or sputtering.

In addition, on the surface of the Si wafer 70A, a resist pattern 72 is formed so as to correspond to the solder sealing frames 86 and the bumps 87 of the hard glass wafer 80A of the surface bond substrate. In this step, the resist pattern 72 is formed so as to correspond to the multilayer films including Sn, Cu, and Ti formed on the hard glass wafer 80A of the surface bond substrate and such that the a sealing frame having a width of about 55 µm is formed.

Next, as shown in FIG. 11B, over the resist pattern 72, a metal film 73 having a multilayer structure composed of Sn (about 0.5 µm thick), Cu (about 3.0 µm thick), and Ti (about 0.1 µm thick) is formed by electron beam deposition. The formation of the metal film 73 may also be performed by plating or sputtering. In this example, for the top electrode and the bottom electrode of the BAW element 70, Al is used. However, to reduce wiring resistance, Cu may also be used. In the case in which Cu is used, the Cu film defining an underlayer of the Sn film may be omitted. That is, only the Sn film defining the bond layer may be formed, and as a result, the number of film-forming steps is decreased.

Next, as shown in FIG. 11C, the resist 72 is removed by a lift-off technique using a solvent, to thereby form a solder sealing frame 74 and bumps 75, each of which has a desired multilayer structure of Sn, Ni, and Ti. The solder sealing frame 74 and the bumps 75 are formed so as to face the solder sealing frame 86 and the bumps 87, respectively.

Figure 12:
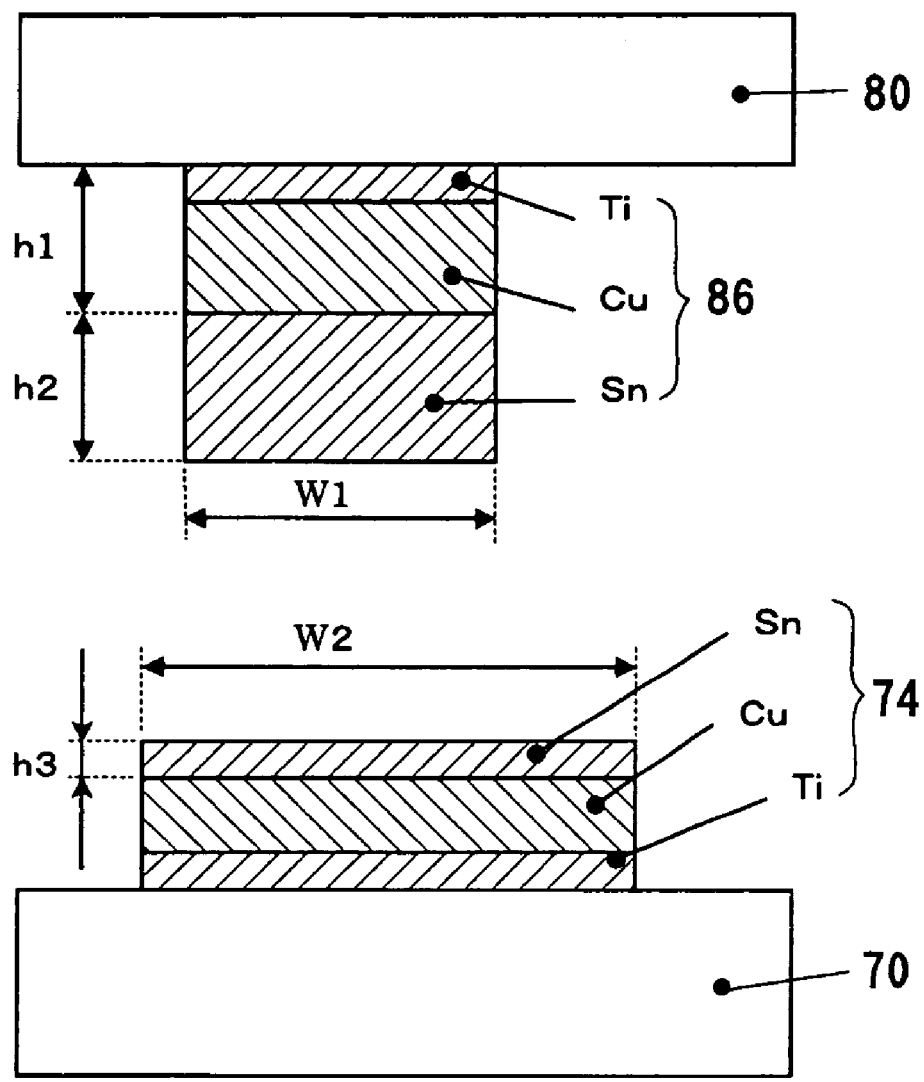
FIG. 12 is a view showing a particular structure in which a sealing frame provided on a BAW element and a sealing frame provided on a surface bond substrate are ready to be bonded to each other.

FIG. 12 shows a sealing frame 74 provided for the BAW element 70 and a sealing frame 86 provided for the surface bond substrate 80, which are to be bonded to each other. In addition, the sealing structure of the BAW element 70 and the rear surface bond substrate 90 is the same as that shown in FIG. 12.

Figures 13A, 13B:
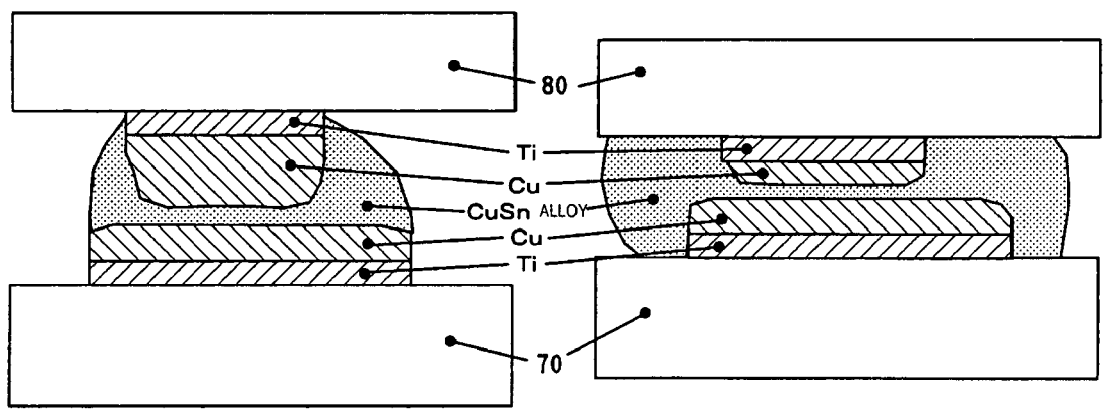
FIGS. 13A and 13B are views showing the structure obtained after sealing frames are bonded to each other.

FIG. 13A shows the structure of the sealing frames 86 and 74 after they are bonded to each other, and FIG. 13B shows a comparative example in which the thickness of Cu of the sealing frame 86 is reduced as compared to that shown in FIG. 13A.

Since each of the bumps preferably have the same structure as that of the sealing frames 74 and 86, a description of the bumps is omitted.

As shown in FIG. 12, a thickness h2 of Sn provided for the surface bond substrate 80 is set so as to absorb variations in in-plane thickness of the surface bond substrate 80 formed of a hard glass wafer and such that bonding and sealing is effectively achieved. In addition, Sn provided for the solder sealing frame 74 and the bumps 75 of the BAW element 70 may be omitted. However, when Sn is provided at the BAW element 70 side, the Sn provided at the surface bond substrate 80 side is likely to get wet with the Sn at the BAW element side and is likely to flow, and hence flow-out of the solder described later is easily controlled, thereby forming the Sn layer.

In addition, the thickness of Cu is set so as to form $Cu_3Sn$ ($\epsilon$ phase) having a high melting point.

It is preferable that the alloy of the solder layer is primarily composed of Cu and Sn, and that the weight percent of Cu of the alloy composed of Sn and Cu be at least about 39 percent by weight.

As shown in FIG. 12, as compared to the sealing frame 74 of the BAW element 70, the width of the sealing frame 86 of the surface bond substrate 80 is reduced, and the thickness of Cu, which is the barrier metal of the sealing frame 86, is increased. The reason for this is that when the thickness of Cu of the sealing frame 86 is reduced, as shown in FIG. 13B, the total thickness of the sealing frame is also reduced, and as a result, excess solder flows out. When this flow-out occurs, a blade used in a subsequent dicing step may be unevenly abraded and chipping may occur more frequently, and/or short-circuiting may occur between the sealing frame and the bumps or among the sealing frame, the bumps, the top electrode, and the bottom electrode, which degrades performance. Accordingly, in order to suppress the flow-out of the solder, the thickness of Cu of the sealing frame 86 of the surface bond substrate 80 is increased, and the electrode width of the sealing frame 74 of the BAW element 70 is increased as compared to that of the surface bond substrate 80. Since the thick Cu layer is not melted during bonding, the Cu layer functions as a spacer. Even when the thickness of the sealing frame is decreased such that excessive solder flows out, the solder only wets the upper surface of the electrode at the BAW element 70 side, and flows thereon. Because of the difference in wettability, the solder is prevented from flowing out from the electrode at the BAW element 70 side (see FIG. 13A). In addition, since the flow-out of the solder is controlled as described above, uniform bonding shapes are formed, and as a result, the yield of sealing is greatly improved.

In addition, the relationship between the width of the sealing frame and the thickness of the barrier metal between the BAW element 70 and the bond substrate 80 may be reversed. That is, as compared to the sealing frame 86 of the surface bond substrate 80, the sealing frame 74 of the BAW element 70 may have a smaller width, and Cu used as the barrier metal of the sealing frame 74, of the BAW element 70 may have a larger thickness.

In order to prevent the flow-out of excessive solder, the dimensions are preferably set as follows. That is, when the width of the sealing frame 86 is represented by W1, the thickness of the metal layer (Ti+Cu) thereof which is not melted at a bonding temperature is represented by h1, the thickness of the metal layer (Sn) which is melted at the bonding temperature is represented by h2, the width of the sealing frame 74 is represented by W2, and the thickness of the metal layer (Sn) thereof which is melted at the bonding temperature is represented by h3, the metal layers are preferably formed such that the following equation is satisfied.

$$W1 \cdot h2 + W2 \cdot h3 \leq h1 \cdot (W2 - W1)$$

In addition, when the solder layer is not provided for the sealing frame 74 (h3=0), the metal layers are preferably formed such that the following equation is satisfied.

$$W1 \cdot h2 \leq h1 \cdot (W2 - W1)$$

The equations described above are also applied to the sealing frame 93 of the rear surface bond substrate 90.

In this example, a CuSn alloy was preferably used. However, if a NiSn alloy or an AuSn alloy is used, the thickness and the composition is determined in the same manner as described above.

For example, if an AuSn alloy is used, the thicknesses of Au and Sn are set to achieve reliable bonding even when thickness variations occur. In addition, the composition of Sn and Au including Au of the BAW element, which forms an alloy during bonding, preferably has a composition from about 20 percent by weight-Sn/Au (eutectic alloy) to about 38 percent by weight-Sn/Au (δ phase), and the composition described above is obtained by controlling the thickness. The reason for this is to prevent the following problem. When heating is performed for bonding, an intermetallic compound of Sn and Ni is grown, and a high melting point metal layer (ζ phase) of AuSn having a high Au concentration is formed, which results in bonding defects. However, when the composition is controlled as described above, even when an intermetallic compound of SnNi is formed, the formation of a high melting point metal layer (ζ phase) having a high Au concentration is suppressed, and the wettability of AuSn solder is ensured, to thereby achieve uniform bonding and sealing. In addition, when the thickness of the barrier layer used as an underlying layer of AuSn is increased, and the width of the corresponding sealing frame is changed, the flow-out described above is prevented.

In addition, when an NiSn alloy is used, as is the case described above, the composition ratio of Sn to Ni may be controlled so as to form a high melting point alloy, and in order to prevent the flow-out, a non-melting metal layer (such as Cu) may be provided as an underlayer. However, since Ni and Sn have low diffusion coefficients and are unlikely to be diffused, the temperature may be increased and/or a diffusion facilitating element, such as Co, may be used.

It is preferable that the alloy of the solder layer, which is formed by alloying and bonding, be primarily composed of Ni and Sn, and that the weight percent of Ni of the alloy composed of Sn and Ni be preferably at least about 73 percent by weight.

The hard glass wafer 80A having the surface bond substrates, the Si wafer 70A having the BAW elements, and the hard glass wafer 90A having the rear surface bond substrate, are arranged and preliminarily fixed. In this step, since the surface bond substrate 80 and the rear surface bond substrate 90 are transparent hard glasses, the BAW element 70 can be seen through the glass, and hence the positioning thereof is easily performed.

Next, the surface bond substrate 80, the BAW element 70, and the rear surface bond substrate 90, which are prelimi-narily fixed, are then thermo compression bonded. By using a bonding apparatus having a high degree of flatness of a thermo compression head and a stage and a uniform in-plane temperature profile, the surface bond substrate 80, the BAW element 70, and the rear surface bond substrate 90 are simultaneously bonded to each other. The bonding conditions are adjusted in accordance with the specific film composition. For example, when the film has a composition ratio of Au to Sn of about 2 to 3, the bonding temperature, time, and pressure were set to about 280° C., about 60 seconds, and about 0.5 MPa, respectively. In addition, to prevent Cu and Sn from oxidizing, bonding was performed by heating in a vacuum atmosphere. When the bonding temperature is too low, a $Cu_3Sn$ alloy (ε phase) is not formed, and as a result, the strength is decreased. On the other hand, when the temperature is too high, properties of a piezoelectric thin film deteriorate. In addition, when the pressure is to low, portions of the wafer may warp and variations in thickness thereof cannot be sufficiently controlled. As a result, sufficient bonding may not be achieved. On the other hand, when the pressure is too high, wafer breakage is likely to occur. Accordingly, the temperature conditions and the pressure conditions must be optimized and carefully controlled.

Figure 14A:
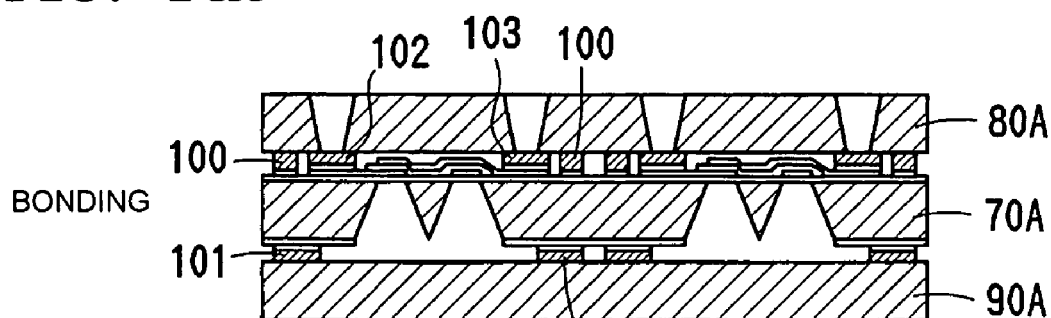
FIGS. 14A and 14B are views showing a surface bond substrate, a BAW element, and a rear surface bond substrate in a bonding step and in a dicing step, respectively.

During this thermo compression bonding, since the Cu and Sn are alloyed, the melted metal spreads such that the bonding is performed, and as a result, a hermetic seal is achieved (see FIG. 14A). When bonding is performed using CuSn, an alloy having a melting point of about 415° C. or more is produced. This alloy does not remelt during heating (to approximately 240° C.) that is performed when the electronic device is mounted on a mother board. Depending on the thickness of the Sn film, a desired alloy may not be obtained by the heating performed during bonding. In this case, the desired alloy is produced by thermal annealing performed after bonding.

In the case of AuSn, bonding and sealing are performed at a temperature of about 330° C. and a pressure of about 0.5 MPa for about 20 seconds. When the temperature is too low, an AuSn alloy in the δ phase and in the ε phase is formed, and a non-melted component is precipitated, thereby degrading solder wettability. On the other hand, when the temperature is too high, devices are damaged, due to the growth of an intermetallic compound of Sn and Ni, the strength is decreased. In addition, when the pressure is too low, portions of the wafer may be warped and variation in thickness thereof cannot be sufficiently controlled, and as a result, bonding may not be well performed in some cases. On the other hand, when the pressure is too high, the bonding thickness is decreased substantially, and as a result, a large amount of an excessive AuSn compound may flow out or the wafer may break.

In this example, the surface bond substrate 80, the BAW element 70, and the rear surface bond substrate 90 were bonded at the same time. However, positioning may first be performed between the surface bond substrate 80 and the BAW element 70 or between the BAW element 70 and the rear surface bond substrate 90, followed by bonding, and thereafter positioning and bonding of the remaining surface bond substrate 80 or rear surface bond substrate 90 may be performed. When the bonding is performed in a vacuum atmosphere, since a difference in pressure is generated between the hollow portion and the exterior portion when the device is recovered from a vacuum chamber, the vibration portion may be damaged. Accordingly, instead of a vacuum atmosphere, the bonding is preferably performed at atmospheric pressure in an inert gas atmosphere (such as $N_2$ at a pressure of about $1\times10^5$ Pa).

Figure 14B:
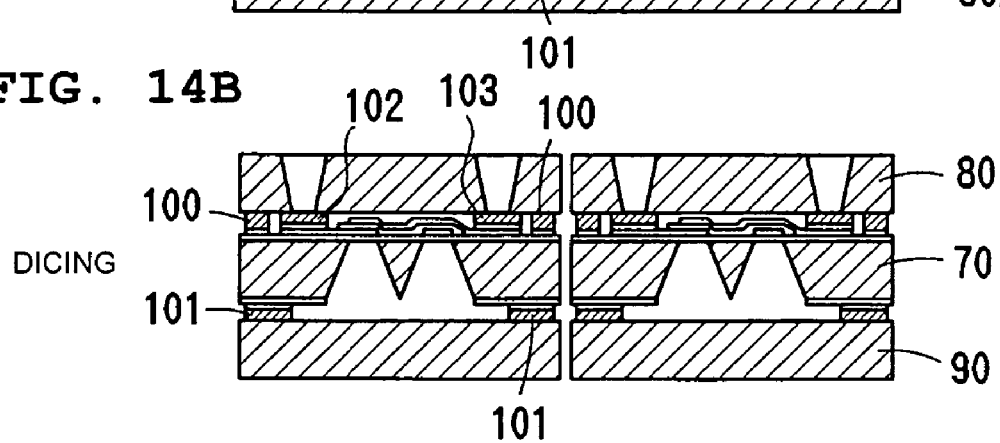

After bonding, dicing is performed, as shown in FIG. 14B, to thereby form CSP piezoelectric filters. To protect the vibration portion of the BAW element from being damaged during dicing, a blade rotational speed and a feed speed must be decreased, and the dicing time is approximately four times that which is required for dicing a general Si material. However, when the vibration portion is protected as in this example, dicing is performed at the conventional dicing speed. As described above, the control of flow-out of the bonding metal is performed so as to prevent uneven abrasion of a dicing blade.

Finally, as inspection of the hermetic seal, the package is immersed in an inert solution (Fluorinert), and the package is checked to determine whether the solution permeates the package by measuring vibration properties of a diaphragm element. Alternatively, inspection may be performed by measuring He gas permeation, by detecting bubble generation when a package is immersed in an inert solution, or by measuring the change in vibration properties caused by a gas pressure difference.

The present invention is not limited to the SAW filter and the BAW filter described in the above preferred embodiment, but may also be applied to other electronic devices requiring a hermetic seal, such as an electronic device including a piezoelectric element which requires a vibration space and an electronic device including a high-frequency element which requires a hollow portion to reduce energy loss.

The present invention is not limited to each of the above-described preferred embodiments, and various modifications are possible within the range described in the claims. An embodiment obtained by appropriately combining technical features disclosed in each of the different preferred embodiments is included in the technical scope of the present invention.

What is claimed is:

1. A method for manufacturing an electronic device which comprises an electronic element having a functional portion and terminal electrodes on a primary surface thereof, and a bond substrate having bond electrodes, which correspond to the terminal electrodes, on a primary surface of the bond substrate, the primary surface of the electronic element facing the primary surface of the bond substrate, the terminal electrodes being bonded to the bond electrodes with bumps provided therebetween for electrical conduction, the electronic element being bonded to the bond substrate with a sealing frame provided therebetween, the sealing frame surrounding the functional portion and the bumps to hermetically seal the electronic device, the method comprising the steps of:

forming a first resist pattern on one of the primary surfaces of the electronic element and the bond substrate, the first resist pattern having openings at locations corresponding to those at which the bumps and the sealing frame are to be formed;

sequentially forming metals over the first resist pattern, the metals being formed into at least one adhesion layer, at least one barrier metal layer, and at least one solder layer;

removing the first resist pattern such that the bumps and the sealing frame are simultaneously formed on said one of the primary surfaces of the electronic element and the bond substrate;

forming a metal layer, which faces the sealing frame, on the primary surface other than said one of the primary surfaces of the electronic element and the bond substrate; and bonding the electronic element and the bond substrate to each other with the bumps and the sealing frame provided therebetween, in which the solder layer is heated such that metals forming the solder layer are alloyed or the solder layer is alloyed with a metal layer adjacent thereto to form metal bonding.

2. The method for manufacturing an electronic device according to claim 1, wherein the step of forming the metal layer, which faces the sealing frame, on said primary surface other than said one of the primary surfaces of the electronic element and the bond substrate, comprises the steps of:

forming a second resist pattern on said primary surface other than said one of the primary surfaces of the electronic element and the bond substrate, the second resist pattern having openings at locations corresponding to those at which the bumps and the sealing frame are to be formed;

sequentially forming metals over the second resist pattern, the metals being formed into at least one adhesion layer, at least one barrier metal layer, and at least one solder layer; and a step of removing the second resist pattern such that the metal layer used as a sealing frame is formed on said primary surface together with bumps.

3. The method for manufacturing an electronic device according to claim 1, wherein the solder layer includes Sn as a primary component and at least one metal selected from the group consisting of Au, Ag, Cu, Zn, Si, Ge, Pb, In, Bi, and Sb;

said at least two metals which form the solder layer are deposited to form a layered structure; and the solder layer having the layered structure including said at least two metals is alloyed by heating.

4. The method for manufacturing an electronic device according to claim 1, wherein the solder layer includes Sn, the barrier metal layer includes one of Au, Ag, Ni, and Cu, and the solder layer is alloyed with a portion of the metal forming the barrier metal layer by heating the solder layer.

5. The method for manufacturing an electronic device according to claim 1, wherein the electrodes and the metal layer facing the bumps and the sealing frame, respectively, have surface portions each of which includes one metal selected from the group consisting of Au, Ag, Ni, and Cu, and the solder layers are alloyed with the metal of the surface portions of the electrodes and the metal layer by heating the solder layers.

6. The method for manufacturing an electronic device according to claim 1, wherein the at least one adhesion layer is made of Ti, the at least one barrier metal layer is made of Ni, and the at least one solder layer includes Sn as a primary component and Cu.

7. The method for manufacturing an electronic device according to claim 1, wherein the step of bonding the electronic element and the bond substrate to each other is performed at a temperature of about 260° C.

8. The method for manufacturing an electronic device according to claim 1, wherein the at least one solder layer includes an Ag layer, an Sn layer and an Au layer.

9. The method for manufacturing an electronic device according to claim 1, wherein the at least one solder layer includes an Ag layer, an Sn layer and an Au layer which are sequentially formed.

10. The method for manufacturing an electronic device according to claim 1, wherein the at least one adhesion layer is made of Ti, the at least one barrier metal layer is made of Cu, and the at least one solder layer includes $Cu_3Sn$ as a primary component.

11. The method for manufacturing an electronic device according to claim 1, wherein the step of bonding the electronic element and the bond substrate to each other is performed at a temperature of about 280° C. for about 60 seconds at a pressure of about 0.5 MPa.

12. The method for manufacturing an electronic device according to claim 1, wherein the electronic element is a surface acoustic wave element.

13. The method for manufacturing an electronic device according to claim 1, wherein the electronic element is a bulk acoustic wave element.

14. The method for manufacturing an electronic device according to claim 2, wherein the width of the sealing frame formed on the primary surface of the electronic element is different from that of the sealing frame formed on the primary surface of the bond substrate, and the thickness of the barrier metal layer forming the sealing frame having a smaller width is larger than that of the barrier metal layer forming the sealing frame having a larger width.

15. The method for manufacturing an electronic device according to claim 6, wherein the at least one adhesion layer has a thickness of about 50 nm, the at least one barrier metal layer has a thickness of about 1.2 µm, and the at least one solder layer has a thickness of about 20 µm.

16. The method for manufacturing an electronic device according to claim 7, wherein the step of bonding the electronic element and the bond substrate to each other is performed in a nitrogen atmosphere containing oxygen at a concentration of about 100 ppm.

17. The method for manufacturing an electronic device according to claim 8, wherein the Ag layer has a thickness of about 0.5 µm, the Sn layer has a thickness of about 20 µm, and the Au layer has a thickness of about 0.1 µm.

18. The method for manufacturing an electronic device according to claim 8, wherein the step of bonding the electronic element and the bond substrate to each other includes the step of heating the at least one solder layer to at least about 232° C. such that the Ag layer is dissolved in the Sn layer to form an SnAg solder alloy.

19. The method for manufacturing an electronic device according to claim 10, wherein the at least one solder layer includes at least about 39 percent by weight of Cu.

* * * * *